(12) United States Patent
Leng

(10) Patent No.: US 12,010,932 B2
(45) Date of Patent: Jun. 11, 2024

(54) RESISTIVE RANDOM ACCESS MEMORY (RRAM) CELLS AND METHODS OF CONSTRUCTION

(71) Applicant: Microchip Technology Incorporated, Chandler, AZ (US)

(72) Inventor: Yaojian Leng, Vancouver, WA (US)

(73) Assignee: Microchip Technology Incorporated, Chandler, AZ (US)

( * ) Notice: Subject to any disclaimer, the term of this patent is extended or adjusted under 35 U.S.C. 154(b) by 293 days.

(21) Appl. No.: 17/379,181

(22) Filed: Jul. 19, 2021

(65) Prior Publication Data

US 2022/0393105 A1    Dec. 8, 2022

Related U.S. Application Data

(60) Provisional application No. 63/208,039, filed on Jun. 8, 2021.

(51) Int. Cl.
*H10N 70/00* (2023.01)
*H10N 70/20* (2023.01)

(52) U.S. Cl.
CPC ......... *H10N 70/841* (2023.02); *H10N 70/066* (2023.02); *H10N 70/24* (2023.02);
(Continued)

(58) Field of Classification Search
CPC .... H10N 70/841; H10N 70/066; H10N 70/24; H10N 70/245; H10N 70/826; H10N 70/8833
See application file for complete search history.

(56) References Cited

U.S. PATENT DOCUMENTS 9,553,265 B1    1/2017    Yang et al.
10,985,316 B2    4/2021    Chen et al.
(Continued)

FOREIGN PATENT DOCUMENTS

DE    102019107906 A1    4/2020 ............. H01L 27/24

OTHER PUBLICATIONS

R. W. Mann et al., Silicides and local interconnections for high performance, IBM J. Res. Develop. vol. 39 No. 4 Jul. 1995 (Year: 1995).*

(Continued)

*Primary Examiner* — Shih Tsun A Chou
(74) *Attorney, Agent, or Firm* — SLAYDEN GRUBERT BEARD PLLC

(57) ABSTRACT

Resistive random access memory (RRAM) cells, for example conductive bridging random access memory (CBRAM) cells and oxygen vacancy-based RRAM (OxR-RAM) cells are provided. An RRAM cell may include a metal-insulator-metal (MIM) structure formed between adjacent metal interconnect layers or between a silicided active layer (e.g., including MOSFET devices) and a first metal interconnect layer. The MIM structure of the RRAM cell may be formed by a damascene process including forming a tub opening in a dielectric region, forming a cup-shaped bottom electrode in the tub opening, forming a cup-shaped insulator in an interior opening defined by the cup-shaped bottom electrode, and forming a top electrode in an interior opening defined by the cup-shaped insulator. The cup-shaped bottom electrode, or a component thereof (in the case of a multi-layer bottom electrode) may be formed concurrent with interconnect vias, e.g., by deposition of tungsten or other conformal metal.

13 Claims, 20 Drawing Sheets

(52) U.S. Cl.
CPC ......... *H10N 70/245* (2023.02); *H10N 70/826* (2023.02); *H10N 70/8833* (2023.02)

(56) References Cited

U.S. PATENT DOCUMENTS

| | | |
|---|---|---|
| 11,049,904 B1 | 6/2021 | Huang et al. |
| 2015/0144859 A1 | 5/2015 | Chen et al. .................. 257/4 |
| 2019/0115394 A1* | 4/2019 | Liu .................. H10N 70/021 |
| 2019/0279994 A1 | 9/2019 | Li |
| 2020/0119088 A1* | 4/2020 | Hashemi .................. H10N 50/01 |
| 2020/0357851 A1 | 11/2020 | Sung et al. |
| 2021/0036057 A1* | 2/2021 | Hsieh .................. G11C 13/0002 |
| 2021/0135105 A1* | 5/2021 | Chen .................. H10N 70/883 |

OTHER PUBLICATIONS

Kozicki, Michael N. et al., "A Low-Power Nonvolatile Switching Element Based on Copper-Tungsten Oxide Solid Electrolyte," IEEE Transactions on Nanotechnology, vol. 5, No. 5, 10 pages, Sep. 1, 2006.

Gibb, Kevin, "Resistive RAM Memory is Finally Here," EE Times, URL: https://www.eetimes.com/resistive-ram-memory-is-finally-here/, 3 pages, Apr. 20, 2015.

Woo, Jiyong et al., "Introduction of WO3 Layer in a Cu-based Al2O3 Conductive Bridge RAM System for Robust Cycling and Large Memory Window," IEEE Journal of the Electron Devices Society, vol. 4, No. 3, pp. 163-166, Apr. 22, 2016.

Zahoor, Furqan et al., "Resistive Random Access Memory (RRAM): an Overview of Materials, Switching Mechanism, Performance, Multilevel Cell (mlc) Storage, Modeling, and Applications," Nanoscale Research Letters, 15, 90, 26 pages, Apr. 22, 2020.

International Search Report and Written Opinion, Application No. PCT/US2021/062134, 10 pages, dated Apr. 21, 2022.

\* cited by examiner

RESISTIVE RANDOM ACCESS MEMORY (RRAM) CELLS AND METHODS OF CONSTRUCTION

RELATED APPLICATION

This application claims priority to commonly owned U.S. Provisional Patent Application No. 63/208,039 filed Jun. 8, 2021, the entire contents of which are hereby incorporated by reference for all purposes.

TECHNICAL FIELD

The present disclosure relates to non-volatile memory (NVM), and more particularly to resistive random access memory (RRAM) cells, e.g., conductive bridging random access memory (CBRAM) and oxygen vacancy-based RRAM (OxRRAM) cells, and methods of construction.

BACKGROUND

Non-volatile memory (NVM) refers to memory that can retain data without an external power supply. NVM is useful for many applications, for example as a microcontroller component. In contrast, static random access memory (SRAM), typically composed of six transistors, needs external power to retain data. Similarly, dynamic random access memory (DRAM), typically including one transistor and one capacitor, also needs external power to retain and refresh data.

Currently, the most common form of NVM is flash memory, which comprises floating-gate based memory cells. NOR type flash memory is typically used for storing code, while NAND type flash memory is typically used for storing data. However, flash memory has various limitations and drawbacks. For example, flash memory is facing difficulty in further size reductions. In addition, flash memory often requires high voltage (typically about 20V) for programming and erasing. Further, production of flash memory cells typically requires several additional photomask processes as compared with a typical CMOS process flow.

Thus, other types of NVM memory have been developed in recent years, including resistive random access memory (RRAM). Two types of RRAM are conductive bridge RRAM (CBRAM) and oxygen vacancy-based RRAM (OxRRAM). A CBRAM memory cell may include two solid metal electrodes, one relatively inert (e.g., tungsten) and the other electrochemically active (e.g., silver or copper), with a solid electrolyte layer located between the two electrodes. The CBRAM memory cell is programmed by applying a bias voltage across the electrolyte layer that causes a physical re-location of ions within the electrolyte layer that forms conductive filaments extending across the electrolyte layer.

FIGS. 1A-1E show an example CBRAM, wherein a positive bias (program) applied to a silver anode causes silver ions to migrate into a germanium sulfide layer (solid electrolyte layer), forming conductive filaments (referred to as a conductive bridge) connecting the silver anode to a tungsten cathode. The conductive filaments, when formed, reduce the resistance between the anode and the cathode, as compared with an unprogrammed CBRAM memory cell. In contrast, a negative bias (erase) reverses this process. In particular, FIG. 1A illustrates a pristine state (or virgin) CBRAM device, FIGS. 1B-1C illustrate oxidation of the silver anode, and migration of the Ag+ cations towards the tungsten cathode and resultant reduction of the Ag+ cations, and FIG. 1D illustrates accumulation of the Ag atoms leading to growth of a conductive filament. FIG. 1E illustrates dissolution of the filament responsive to application of the opposite polarity.

In contrast, in an OxRRAM cell the conductive bridge is formed by creation of a vacancy chain in a solid electrolyte layer arranged between two electrodes. The creation of the filament/vacancy-chain creates an on-state (high conduction between the electrodes, i.e. low resistance), while the dissolution of the filament/vacancy-chain (achieved by applying a similar polarity with Joule heating current or an opposite polarity but with smaller currents) reverts the electrolyte layer back to its nonconductive, or high resistance, off-state.

Construction of CBAM and OxRRAM cells typically requires at least one additional photomask layer, relative to the background IC fabrication process, and typically involves a difficult plasma etch process for the electrode formation (i.e., an exotic electrode metal etch). There is a need to build RRAM cells, e.g., CBRAM or OxRRAM cells, at lower cost (e.g., by eliminating or reducing added photomask layers) and improved manufacturing processes (e.g., by eliminating the need for the exotic electrode metal etch).

SUMMARY

The present disclosure provides RRAM cells, for example CBRAM and OxRRAM cells, and methods of constructing such RRAM cells. An RRAM cell may include a metal-insulator-metal (MIM) structure formed between adjacent metal interconnect layers or between an active layer (e.g., including MOSFET devices) and a metal interconnect layer, e.g., metal-1 layer. The MIM structure of the RRAM cell may be formed by a process including forming a tub opening in a dielectric region, forming a cup-shaped bottom electrode in the tub opening, forming a cup-shaped insulator in an interior opening defined by the cup-shaped bottom electrode, and forming a top electrode in an interior opening defined by the cup-shaped insulator. The cup-shaped bottom electrode, or a component thereof (in the case of a multi-layer bottom electrode) may be formed concurrent with interconnect vias, e.g., by deposition of tungsten or other conformal metal. In some example, the RRAM cell may be formed without adding any photomask processes to a background integrated circuit fabrication process, e.g., a typical CMOS fabrication process.

One aspect provides a method of forming an integrated circuit structure including a resistive random access memory cell. The method includes forming a tub opening in a dielectric region, forming a cup-shaped bottom electrode in the tub opening, forming a cup-shaped insulator in an interior opening defined by the cup-shaped bottom electrode, forming a top electrode in an interior opening defined by the cup-shaped insulator, and forming an upper metal layer over the dielectric region, the upper metal layer including a top electrode contact in contact with the top electrode. The cup-shaped bottom electrode, the cup-shaped insulator, and the top electrode define the resistive random access memory cell.

In some examples, the resistive random access memory cell is formed by a damascene process. Further, in some examples, the resistive random access memory cell is formed without adding any photomask processes to a background integrated circuit fabrication process.

In some examples, before forming the upper metal layer over the dielectric region, a top surface of the top electrode is planarized with a top surface of the dielectric region, and a diffusion barrier layer comprising a dielectric material is deposited to cover the planarized top surface of the top electrode. In one example, forming the upper metal layer over the dielectric region comprises etching an upper dielectric layer to form a top electrode contact opening for forming the top electrode contact, and the diffusion barrier layer acts as an etch stop during the etch.

In some examples, the top electrode comprises silver, copper, or platinum.

In some examples, the method includes concurrently forming the tub opening and a via opening in the dielectric region, and depositing a conformal metal to concurrently form the cup-shaped bottom electrode in the tub opening and a via in the via opening. In some examples, forming the upper metal layer over the dielectric region comprises concurrently forming the top electrode contact in contact with the top electrode and an upper interconnect element in contact with the via.

In some examples, forming the cup-shaped bottom electrode in the tub opening includes depositing a conformal first metal to form a cup-shaped bottom electrode outer component in the tub opening concurrently with the via in the via opening, and depositing a conformal second metal over the cup-shaped bottom electrode outer component to form a cup-shaped bottom electrode inner component. In some examples, the conformal first metal comprises tungsten or cobalt, and the conformal second metal comprises platinum.

In some examples, the resistive random access memory cell comprises a conductive bridging random access memory cell.

In some examples, the cup-shaped insulator comprises $GeS_2$, $Al_3O_3$, or $WO_3$.

In some examples, the resistive random access memory cell comprises an oxygen vacancy-based resistive random access memory cell.

In some examples, the cup-shaped bottom electrode comprises platinum.

In some examples, the cup-shaped insulator comprises $Al_3O_3$, $Ta_2O_5$, or $HfO_2$.

Another aspect provides an integrated circuit structure including a dielectric region including a tub opening; a resistive random access memory cell structure formed in the tub opening and including a cup-shaped bottom electrode, a cup-shaped insulator, and a top electrode; and an upper metal layer over the dielectric region and including a top electrode contact in contact with the top electrode.

In some examples, the resistive random access memory cell comprises a damascene structure.

In some examples, the dielectric region is formed over a lower metal layer including a lower interconnect element, and the resistive random access memory cell structure is conductively connected between the lower interconnect element in the lower metal layer and the top electrode contact in the upper metal layer.

In some examples, the dielectric region is formed over a transistor including a doped source region and a doped drain region, and the cup-shaped bottom electrode of the resistive random access memory cell structure is conductively coupled to a silicide region formed on the doped source region or the doped drain region of the transistor.

In some examples, the integrated circuit structure includes a via formed in a via opening in the dielectric region, and the upper metal layer includes an interconnect element in electrical contact with the via.

In some examples, the cup-shaped bottom electrode includes a cup-shaped bottom electrode outer component formed in the tub opening, and a cup-shaped bottom electrode inner component formed on the cup-shaped bottom electrode outer component and formed from a different material than the cup-shaped bottom electrode outer component.

In some examples, the cup-shaped bottom electrode outer component comprises tungsten or cobalt, and the cup-shaped bottom electrode inner component comprises platinum.

In some examples, the top electrode comprises silver, copper, or platinum.

In some examples, the resistive random access memory cell comprises a conductive bridging random access memory cell.

In some examples, the cup-shaped insulator comprises $GeS_2$, $Al_3O_3$, or $WO_3$.

In some examples, the resistive random access memory cell comprises an oxygen vacancy-based resistive random access memory cell.

In some examples, the cup-shaped insulator comprises $Al_3O_3$, $Ta_2O_5$, or $HfO_2$.

BRIEF DESCRIPTION OF THE DRAWINGS

Example aspects of the present disclosure are described below in conjunction with the figures, in which.

Figure 1E:
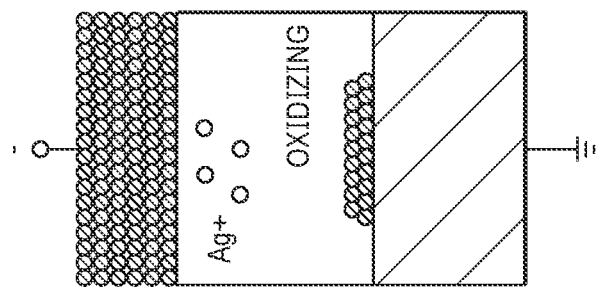
FIGS. 1A-1E show the basic operation of an example CBRAM cell.
Figure 1D:
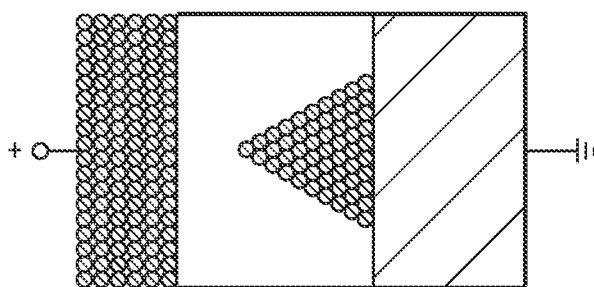
Figure 1C:
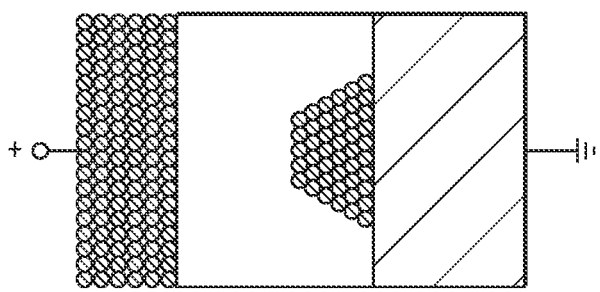
Figure 1B:
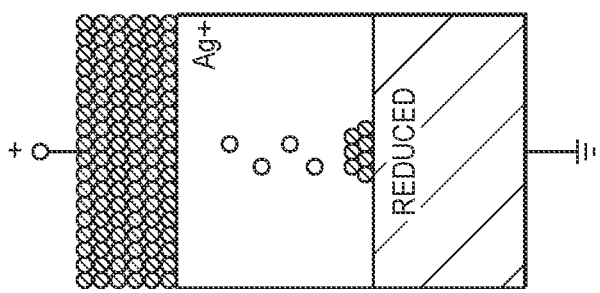
Figure 1A:
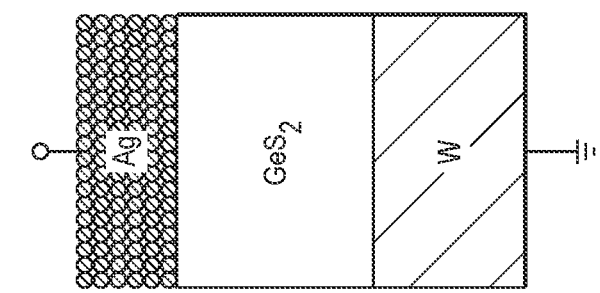

It should be understood that the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

The present disclosure provides Resistive Random Access Memory (RRAM) cells, for example, CBRAM and OxRRAM cells, including (a) a cup-shaped metal/insulator/metal (MIM) structure formed between adjacent metal interconnect layers or between a silicided active region and an interconnect layer, e.g., metal-1 layer and (b) a top contact. Such RRAM cells may be formed in accordance with the present disclosure without any added mask layers, as compared with a background CMOS fabrication process.

An RRAM cell can be perceived as a two-terminal device with a sandwiched metal/insulator/metal (MIM) structure, with an optional insulator cap layer to improve cell performance (improved program, erase, or reliability).

As used herein, a "metal layer," for example in the context of the lower metal layer $M_x$ and upper metal layer $M_{x+1}$, may comprise any metal or metalized layer or layers, including:

(a) a metal interconnect layer, e.g., comprising copper, aluminum or other metal formed by a damascene process or deposited by a subtractive patterning process (e.g., deposition, patterning, and etching of a metal layer), or (b) a silicided active region including a number of silicided structures (structures having a metal silicide layer formed thereon), for example a silicided source region, drain region, or polysilicon gate of a MOSFET.

For example, an RRAM cell structure may be constructed between two adjacent metal interconnect layers $M_x$ and $M_{x+1}$ at any depth in an integrated circuit structure. As another example, an RRAM cell structure may be constructed over a silicided active region, in particular on a silicon transistor having metal silicide layers formed on selected transistor components, and below a first metal interconnect layer (often referred to as Metal-1); in such an example, the silicided active region defines the lower metal layer $M_x$ where x=0 (i.e., $M_0$) and the first metal interconnect layer (Metal-1) defines the upper metal layer $M_{x+1}$ (i.e., $M_1$).

In some examples, the RRAM cell, in particular the MIM structure of the RRAM cell, may be formed concurrent with certain interconnect structures, e.g., interconnect via, separate from the RRAM cell. For example, a cup-shaped bottom electrode (or a component thereof) of the RRAM cell may be formed concurrent with interconnect vias, by deposition of a conformal metal layer, e.g., tungsten, into respective openings for the cup-shaped bottom electrode and interconnect vias. For example, FIGS. 2A, 3A-3G, 4, 5A-5B, and 6A-6G show example RRAM cells formed concurrent with interconnect via.

In other examples, the RRAM cell, in particular the MIM structure of the RRAM cell, may be formed distinct (non-concurrent) from interconnect structures, e.g., interconnect vias. For example, FIG. 2B shows an RRAM cell structure having an MIM structure formed distinct (non-concurrent) from interconnect vias. Each example RRAM cell shown in FIGS. 3A-3G, 4, 5A-5B, and 6A-6G may similarly be formed distinct (non-concurrent) from interconnect structures, e.g., interconnect vias.

As discussed below with reference to FIGS. 3A-3G, in some examples the RRAM cell may be constructed without adding any mask operations to the background integrated circuit fabrication process.

Figure 2A:
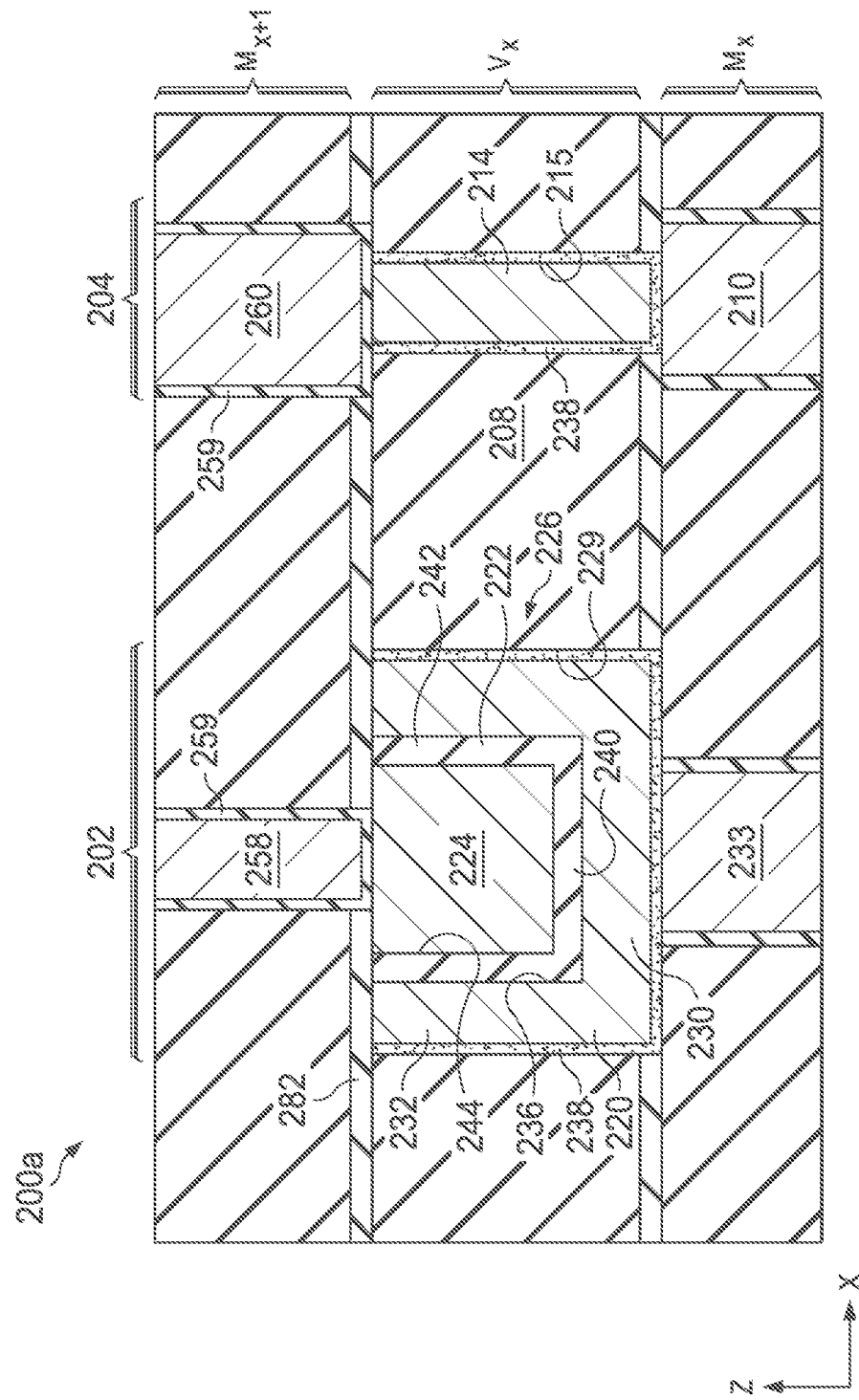
FIG. 2A shows an example integrated circuit structure including an example CBRAM cell and a nearby interconnect structure formed between two metal interconnect layers.
Figure 2B:
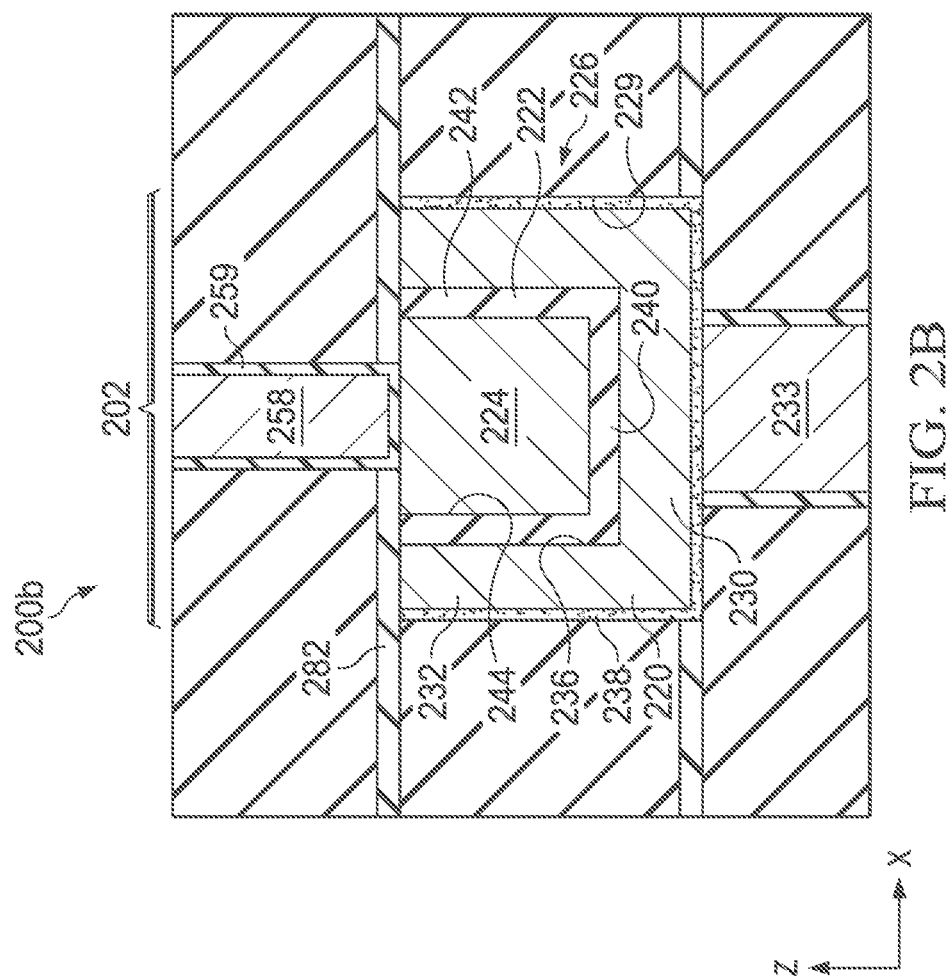
FIG. 2B shows an example integrated circuit structure including an example CBRAM cell between two metal interconnect layers.

FIG. 2A shows an example integrated circuit structure 200a including an example CBRAM cell 202 and an interconnect structure 204. As indicated above a CBRAM cell is one example of an RRAM cell, and thus CBRAM cell 202 may be interchangeably called RRAM cell 202. The CBRAM cell 202 includes a three-dimensional (3D) metal/insulator/metal (MIM) structure formed between a lower metal layer $M_x$ and an upper layer $M_{x+1}$. In the example shown in FIG. 2A-2B and FIGS. 3A-3G, the lower metal layer $M_x$ and an upper layer $M_{x+1}$ are two adjacent metal interconnect layers, such that the CBRAM cell 202 is formed in a via layer $V_x$ between the two adjacent metal interconnect layers $M_x$ and $M_{x+1}$. In other examples, as shown in FIG. 4 discussed below, the CBRAM cell 202 is formed in a via layer $V_x$ between a silicided active region (including one or more silicon-based transistors including silicided structures) $M_0$ and a metal interconnect layer $M_1$ (often referred to as Metal-1). Via layer $V_x$ may comprise various conductive structures formed in a dielectric region 208, e.g., an oxide region.

As shown in FIG. 2A, the interconnect structure 204 may include a lower interconnect element 210 formed in a lower metal layer $M_x$ (for example, where x=0 for a silicided active layer as discussed above) and an upper interconnect element 260, e.g., metal-1 layer, formed in an upper metal layer $M_{x+1}$ and connected to the lower interconnect element 210 by at least one interconnect via 214 formed in via layer $V_x$ by depositing a conformal metal, e.g., tungsten, cobalt or aluminum, into respective via openings 215. Each of the lower interconnect element 210 and upper interconnect element 260 may comprise a wire or other laterally elongated structure (e.g., elongated in the y-axis direction), or a discrete pad (e.g., having a square, circular, or substantially square or circular shape in the x-y plane), or any other suitable shape and structure.

The CBRAM cell 202 includes a metal-insulator-metal (MIM) CBRAM structure 226 formed in a tub opening 229 in the via layer $V_x$. The MIM CBRAM structure 226 includes a cup-shaped bottom electrode 220, a cup-shaped insulator 222 formed on the cup-shaped bottom electrode 220, and a top electrode 224 formed in an interior opening defined by the cup-shaped insulator 222. The cup-shaped bottom electrode 220 includes (a) a laterally-extending bottom electrode base 230 in contact with an underlying metal interconnect element 233 and (b) multiple vertically-extending bottom electrode sidewalls 232 extending upwardly from the laterally-extending bottom electrode base 230.

As discussed below with reference to FIGS. 3A and 3B, the cup-shaped bottom electrode 220 may formed concurrently with the interconnect via 214 by depositing the conformal metal, e.g., tungsten, cobalt or aluminum, into the tub opening 229 and via opening 215 in via layer $V_x$. In some example, a glue layer 238, e.g., comprising titanium nitride (TiN), is deposited in the tub opening 229 and via opening 215 prior to the conformal metal, to improve adhesion between the conformal metal and dielectric region 208.

In one example, the bottom electrode base 230 may have a rectangular perimeter (e.g., having a square or non-square rectangular shape) defining four lateral sides when viewed from above, with four vertically-extending bottom electrode sidewalls 232 extending upwardly from the four lateral sides of the rectangular perimeter. The cup-shaped bottom electrode 220 may include any other number of vertically-extending bottom electrode sidewalls 232 extending upwardly from the bottom electrode base 230.

The laterally-extending bottom electrode base 230 and vertically-extending bottom electrode sidewalls 232 define an interior opening 236 of the cup-shaped bottom electrode 220. As shown, the cup-shaped insulator 222 is formed in the interior opening 236 defined by the cup-shaped bottom electrode 220 and includes a laterally-extending insulator base 240, formed over the bottom electrode base 230, and multiple vertically-extending insulator sidewalls 242 extending upwardly from the laterally-extending insulator base 240, with each vertically-extending insulator sidewall 242 formed on (laterally adjacent) a respective bottom electrode sidewall 232. The cup-shaped insulator 222 may comprise germanium disulfide ($GeS_2$), $WO_3$, $Al_3O_3$, a mixture of $WO_3$ and $Al_3O_3$, or other suitable insulator material.

The laterally-extending insulator base 240 and vertically-extending insulator sidewalls 242 define an interior opening 244. The top electrode 224 is formed inside and fills the interior opening 244 defined by the cup-shaped insulator 222. The top electrode 224 may comprise silver (Ag), copper (Cu), platinum (Pt), or other suitable metal.

A diffusion barrier layer 282, which may comprise a dielectric material, such as SiN or SiC, without limitation, may be formed over the top electrode 224, insulator sidewalls 242, bottom electrode sidewalls 232, and interconnect via 214. The diffusion barrier layer 282 may be formed prior to formation of the upper metal layer $M_{x+1}$ to provide an etch stop for a subsequent $M_{x+1}$ trench metal etch (for forming upper interconnect element and a top electrode contact 260).

Diffusion barrier layer 282 may be formed over the MIM CBRAM structure 226 to provide a barrier against diffusion from the top electrode 224 (e.g., silver diffusion). In some examples, the diffusion barrier layer 282 may comprise silicon nitride (SiN), silicon carbide (SiC), or a high-k dielectric material (e.g., having a dielectric constant above 7). In addition to providing a diffusion barrier, the diffusion barrier layer 282 may act as an etch stop during construction of the upper metal layer $M_{x+1}$, e.g., during a damascene etch for creating metal elements in upper metal layer $M_{x+1}$. The diffusion barrier layer 282 may also provide an effective termination layer for the edge electric field of the CBRAM cell 202 to improve the breakdown voltage of the CBRAM cell 202.

The upper metal layer ($M_{x+1}$) formed over the via layer $V_x$ (including interconnect via 214 and MIM CBRAM structure 226) includes a top electrode contact 258 in electrical contact with the CBRAM top electrode 224 and an upper interconnect element 260 in electrical contact with the interconnect via 214. In some embodiments, the top electrode contact 258 and upper interconnect element 260 comprise damascene elements formed by a damascene process, e.g., using copper, tungsten, or aluminum. For example, top electrode contact 258 and upper interconnect element 260 may comprise copper damascene elements formed over a barrier layer 259, e.g., a TaN/Ta bilayer.

Each of the top electrode contact 258 and upper interconnect element 260 may comprise a wire or other laterally elongated structure (e.g., elongated in the y-axis direction), or a discrete pad (e.g., having a square, circular, or substantially square or circular shape in the x-y plane), or any other suitable shape and structure.

Thus, according to the example process described above, the MIM CBRAM structure 226, in particular the cup-shaped bottom electrode 220, may be formed concurrent with the interconnect structure 204, in particular via 214. As noted above, in other examples the MIM CBRAM structure 226 may be formed distinct (non-concurrent) from interconnect structure 204 (e.g., distinct from via 214).

FIG. 2B shows an example integrated circuit structure 200b including an example CBRAM cell 202, wherein the MIM CBRAM structure 226 is formed distinct (non-concurrent) from interconnect vias. Each example RRAM cell shown in FIGS. 3A-3G, 4, 5A-5B, and 6A-6G may similarly be formed distinct (non-concurrent) from interconnect structures, e.g., interconnect vias.

Figure 3A:
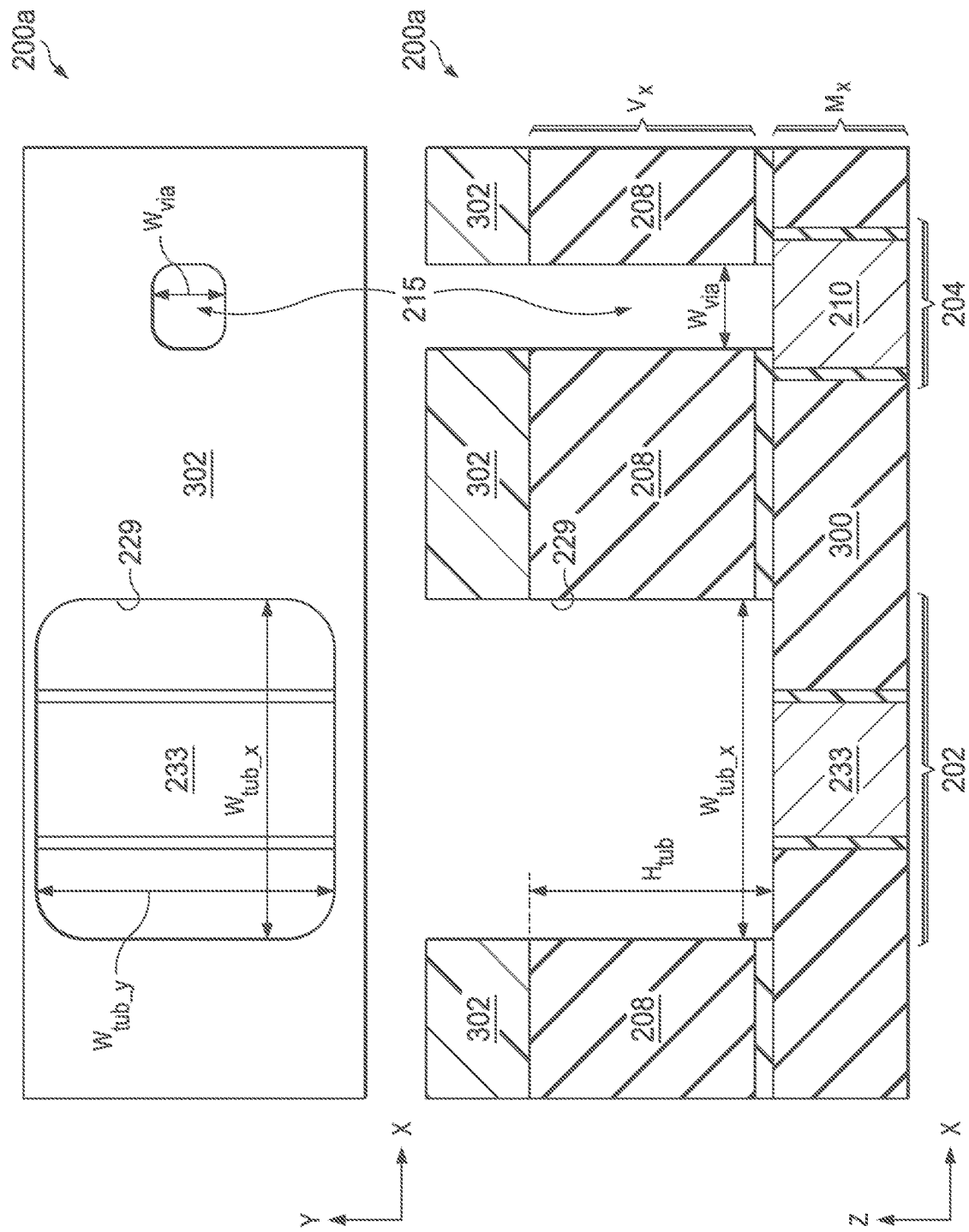
FIGS. 3A-3G illustrate an example process for forming the integrated circuit structure shown in FIG. 2A, including the example CBRAM cell and interconnect structure.

FIGS. 3A-3G illustrate an example process for forming the integrated circuit structure 200a shown in FIG. 2A, including the example CBRAM cell 202 and example interconnect structure 204. Those skilled in the art will recognize that the same process, without reference to interconnect structure 204, can be used to form the integrated circuit structure 280 shown in FIG. 2B. First, as shown in FIG. 3A, which includes a top view (x-y plane) and a side cross-sectional via (x-z plane) of the integrated circuit structure 200a being formed, an inter-metal dielectric (IMD) region 208, e.g., comprising an oxide, is formed over a lower metal layer $M_x$ including lower interconnect elements 210 and 233. Lower interconnect elements 210 and 233 may comprise copper elements formed by a damascene process. Each lower interconnect element 210 and 233 of lower metal layer $M_x$ 300 may comprise a wire or other laterally elongated structure (e.g., elongated in the y-axis direction), or a discrete pad (e.g., having a square, circular, or substantially square or circular shape in the x-y plane), or any other suitable shape and structure.

A photoresist layer 302 may be deposited and patterned to form photoresist openings, and the underlying IMD region 208 is etched through the photoresist openings to form a tub opening 229 for the formation of MIM CBRAM structure 226 and multiple via openings 215 in the IMD region 208. One via opening 215 is shown in FIG. 3A. Via opening 215 may have a square, circular, or other suitable shape from a top view (x-y plane), with a width (or diameter or critical dimension (CD)) $W_{via}$ in both the x-direction and y-direction in the range of 0.1-0.35 μm, or for example.

In contrast, the tub opening 229 may have a substantially greater width $W_{tub\_x}$ in the x-direction and/or width $W_{tub\_y}$ in the y-direction than via opening 215. The shape and dimensions of the tub opening 229 may be selected based on various parameters, e.g., for effective manufacturing of the MIM CBRAM structure 226 and/or for desired performance characteristics of the resulting CBRAM cell 202. In one example, the tub opening 229 may have a square or rectangular shape in the x-y plane. In other examples, tub opening 229 may have a circular or oval shape in the x-y plane.

As noted above, a width of tub opening 229 in the x-direction ($W_{tub\_x}$), y-direction ($W_{tub\_y}$), or both the x-direction and y-direction ($W_{tub\_x}$ and $W_{tub\_y}$) may be substantially larger than both the width $W_{via}$ of via openings 215 in the x-direction and width $W_{via}$ of via openings 215 in the y-direction. For example, in some examples, each width of $W_{tub\_x}$ and $W_{tub\_y}$ of tub opening 229 is at least twice as large as the width $W_{via}$ of via openings 215. In particular examples, each width $W_{tub\_x}$ and $W_{tub\_y}$ of tub opening 229 is at least five time as large as the width $W_{via}$ of via opening 215. Each width of tub opening 229 ($W_{tub\_x}$ and $W_{tub\_y}$) may be sufficient to allow a construction of the MIM CBRAM structure 226 within the tub opening 229 by a damascene process, for example allowing the construction of cup-shaped bottom electrode 220, cup-shaped insulator 222 formed in interior opening 236 of the cup-shaped bottom electrode 220, and top electrode 224 formed in interior opening 244 of the cup-shaped insulator 222. In some examples, $W_{tub\_x}$ and $W_{tub\_y}$ are each in the range of 0.5-100 μm, for example in the range of 0.5-10 μm.

Further, tub opening 229 may be formed with a height-to-width aspect ratio of less than or equal to 2.0 in both the x-direction and y-direction, e.g., to allow effective filling of the tub opening 229 by conformal materials. For example, tub opening 229 may be formed with aspect ratios $H_{tub}/W_{tub\_x}$ and $H_{tub}/W_{tub\_y}$ each in the range of 0.1-2.0, for example in the range of 0.5-2.0. In some examples, aspect ratios $H_{tub}/W_{tub\_x}$ and $H_{tub}/W_{tub\_y}$ are each less than or equal to 1.5, e.g., for effective filling of tub opening 229 by conformal materials, e.g., tungsten, cobalt, or aluminum. For example, tub opening 229 may be formed with aspect ratios $H_{tub}/W_{tub\_x}$ and $H_{tub}/W_{tub\_y}$ each in the range of 0.5-1.5, or more particularly in the range of 0.8-1.2.

Figure 3B:
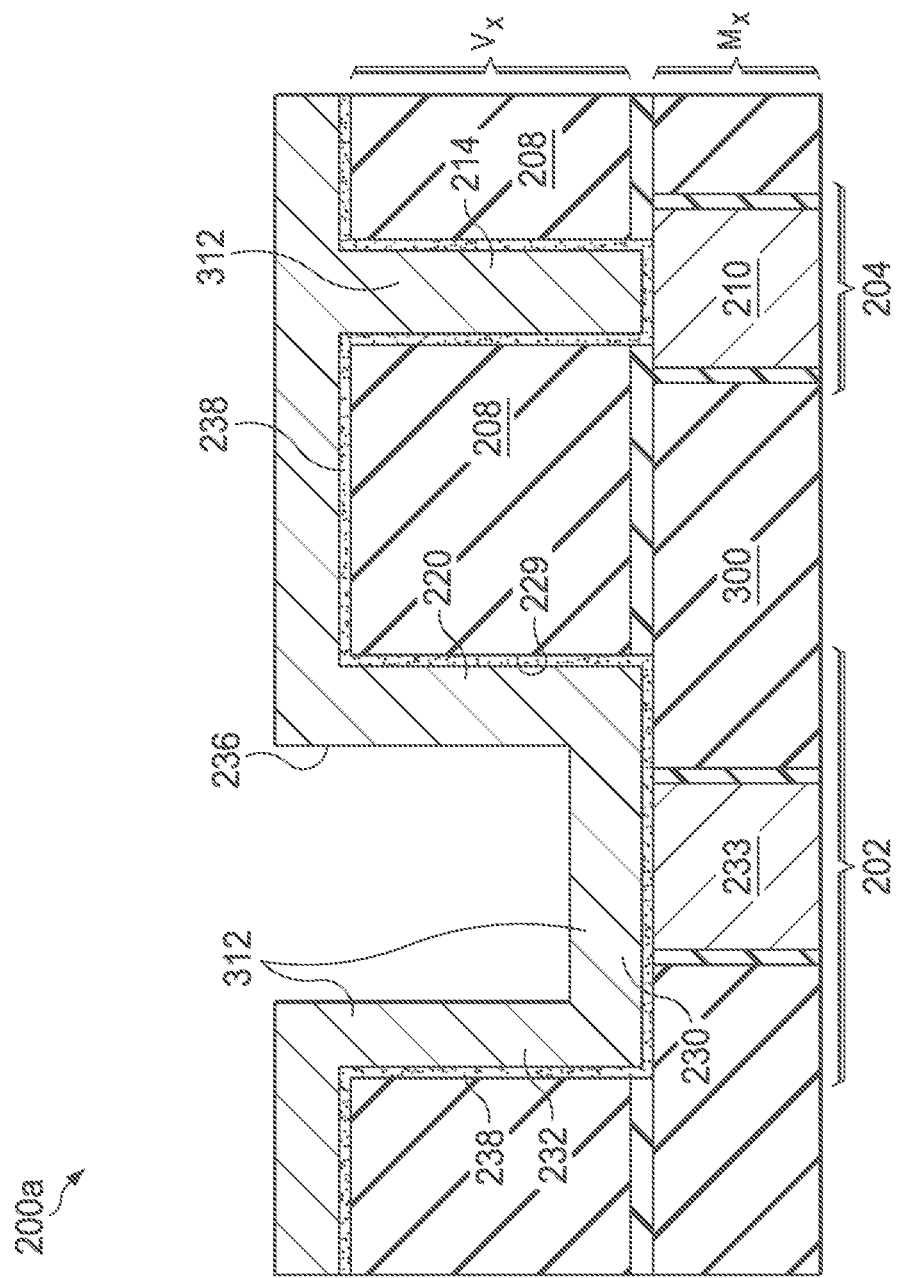
Figure 4:
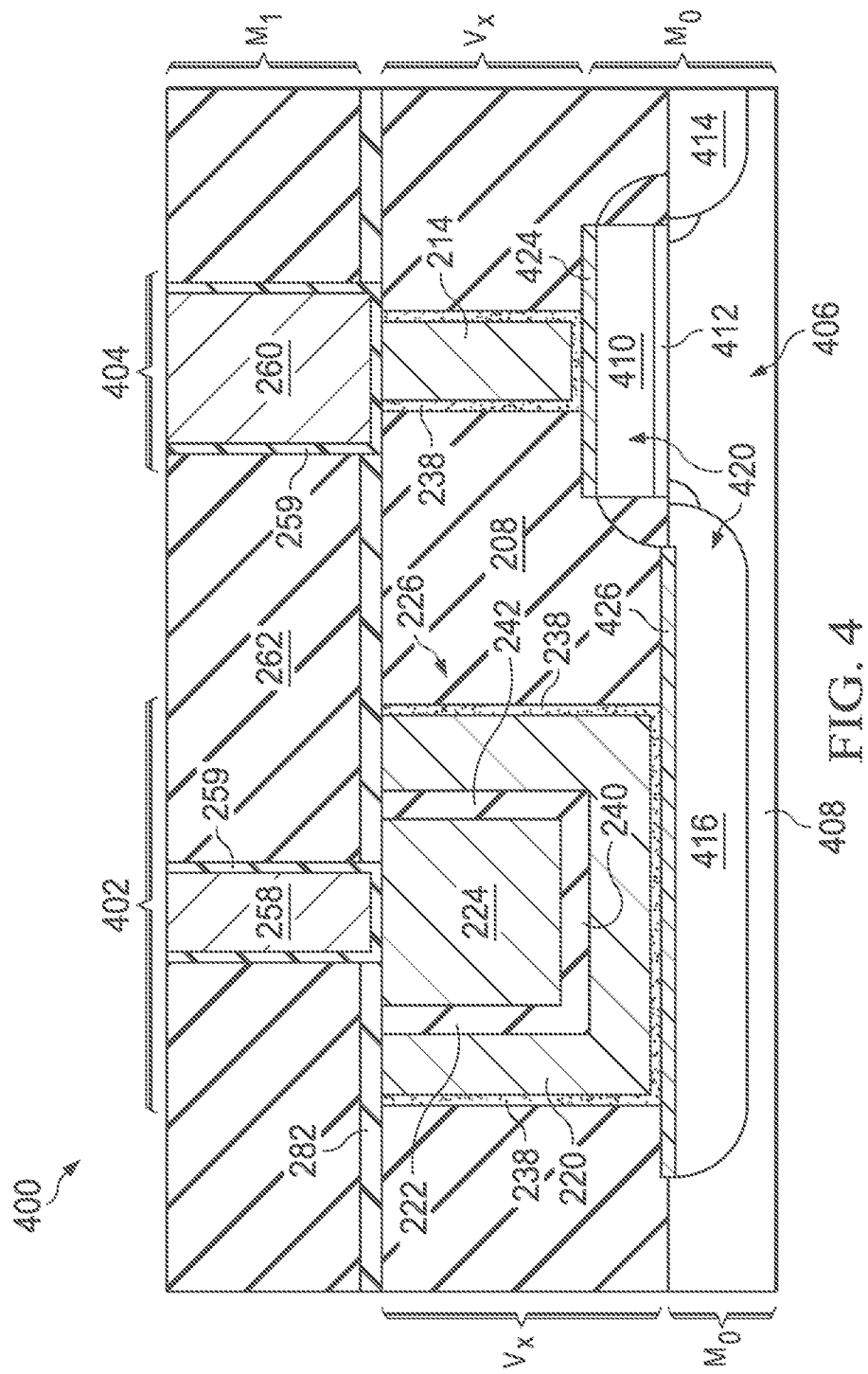
FIG. 4 shows an example integrated circuit structure including the example CBRAM cell and an interconnect structure of FIG. 2A, formed between a silicided active region including a MOSFET transistor and a metal interconnect layer.

Next, as shown in FIG. 3B, photoresist layer 302 is removed, and a glue layer 238, e.g., comprising TiN, is deposited over the IMD region 208 and extends down into the tub opening 229 and into via opening 215. The glue layer 238 may be deposited using a refractive physical vapor deposition (PVD) process or a chemical vapor deposition (CVD) process. In some examples, the glue layer 238 may have a thickness in the range of 50-500 Å.

A conformal metal layer 312 is then deposited over the glue layer 238 and extends down into the tub opening 229 and into the via opening 215. As shown, the deposited conformal metal layer 312 (a) fills interconnect via opening 215 to form the interconnect via 214 and (b) covers the interior surfaces of the tub opening 229 to form the cup-shaped bottom electrode 220 defining interior opening 236. As discussed above, the cup-shaped bottom electrode 220 includes multiple (in this example, four) vertically-extending bottom electrode sidewalls 232 extending upwardly from the laterally-extending bottom electrode cup base 230. In one example, the conformal metal layer 312 comprises tungsten deposited with a thickness of 1000 Å to 5000 Å. In other examples, the conformal metal layer 312 may comprise cobalt, aluminum, or other conformal metal. The conformal metal layer 312 may be deposited by a conformal chemical vapor deposition (CVD) process or other suitable deposition process. The glue layer 238 (e.g., comprising TiN) may increase or enhance an adhesion of the conformal metal layer 312 to the interior surfaces of the tub opening 229, including vertical sidewall surfaces of tub opening 229, to facilitate the formation of the cup-shaped bottom electrode 220.

Figure 3C:
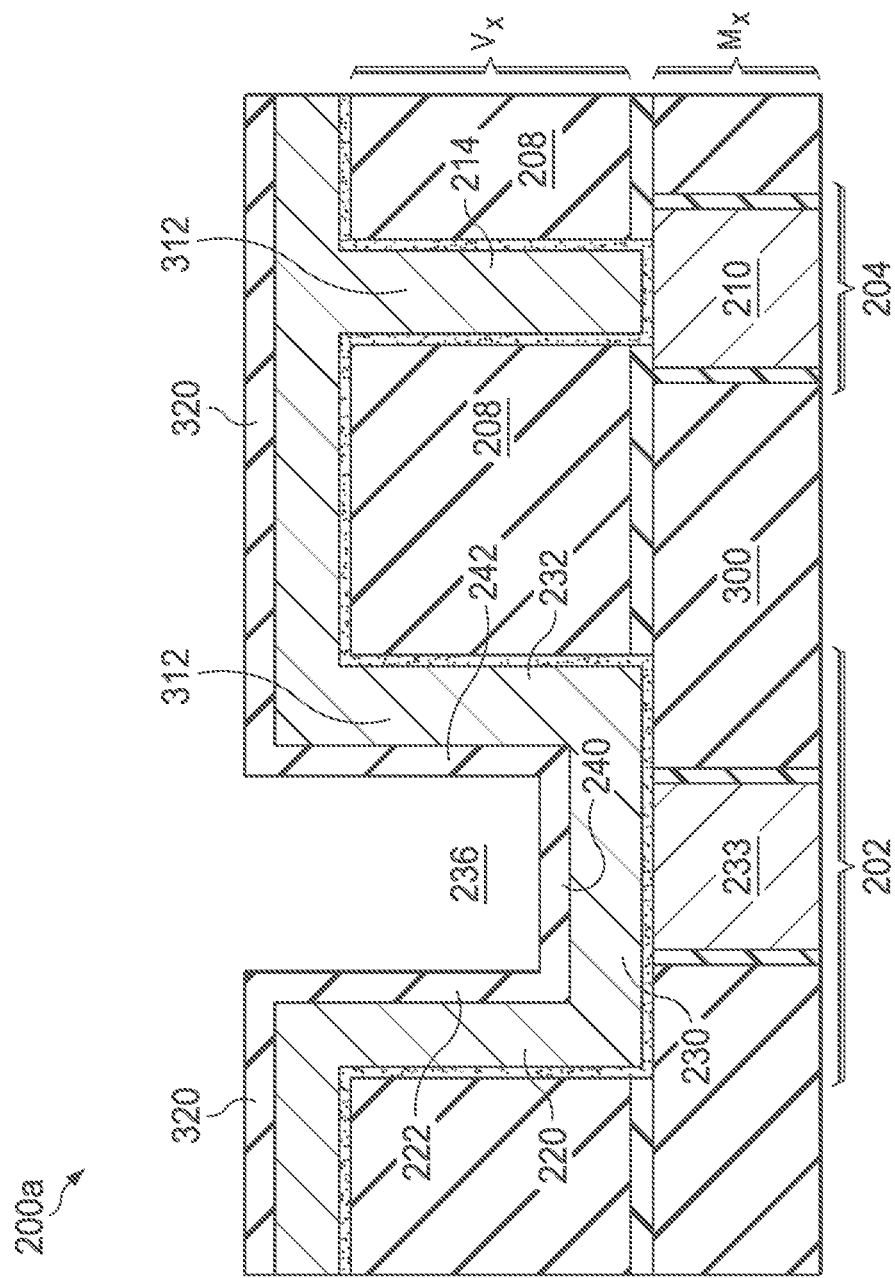

Next, as shown in FIG. 3C, an insulator layer 320 is deposited or formed over the conformal metal layer 312 and extends down into the interior opening 236 defined by the cup-shaped bottom electrode 220 to define the cup-shaped insulator 222. In some examples, the insulator layer 320 may comprise $GeS_2$, $Al_2O_3$, $WO_3$, or $WO_3$ plus $Al_2O_3$, and may be deposited by a CVD or PVD process, or alternatively may be formed by oxidizing the conformal metal layer 312, for example by oxidizing the tungsten conformal metal layer 312 to form a tungsten oxide ($WO_3$) insulator layer 320. In some examples, the insulator layer 320 may have a thickness in the range of 300-1000 Å, for example in the range of 400-600 Å.

Figure 3D:
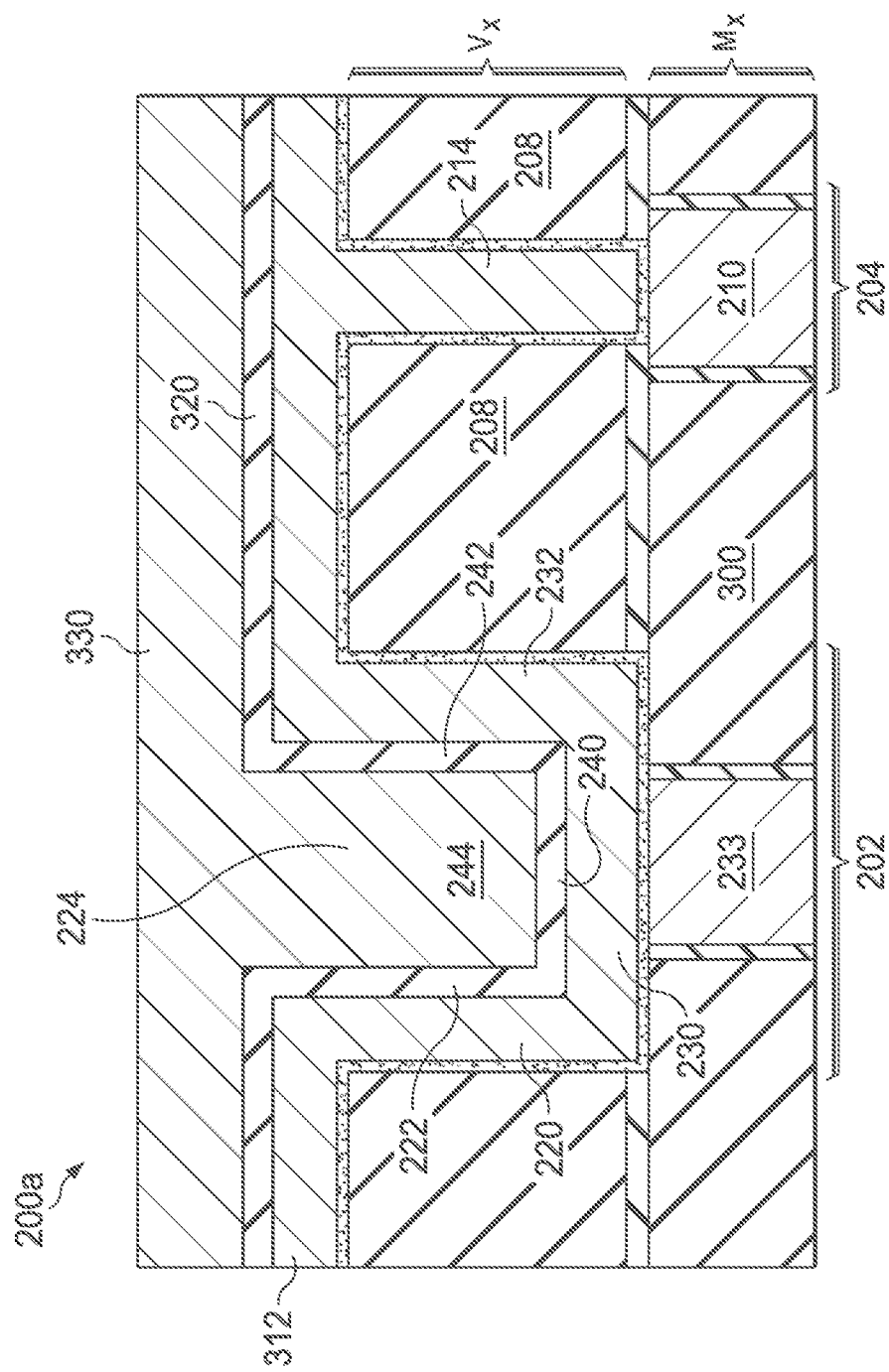

Next, as shown in FIG. 3D, a top electrode layer 330 may be deposited over the insulator layer 320 and extending down into an interior opening 244 defined by the cup-shaped insulator 222, to define the top electrode 224. The top electrode layer 330 may comprise silver, copper, platinum, or other suitable electrode material, and may be deposited by a PVD process and with a sufficient thickness to fill the interior opening 244.

Figure 3E:
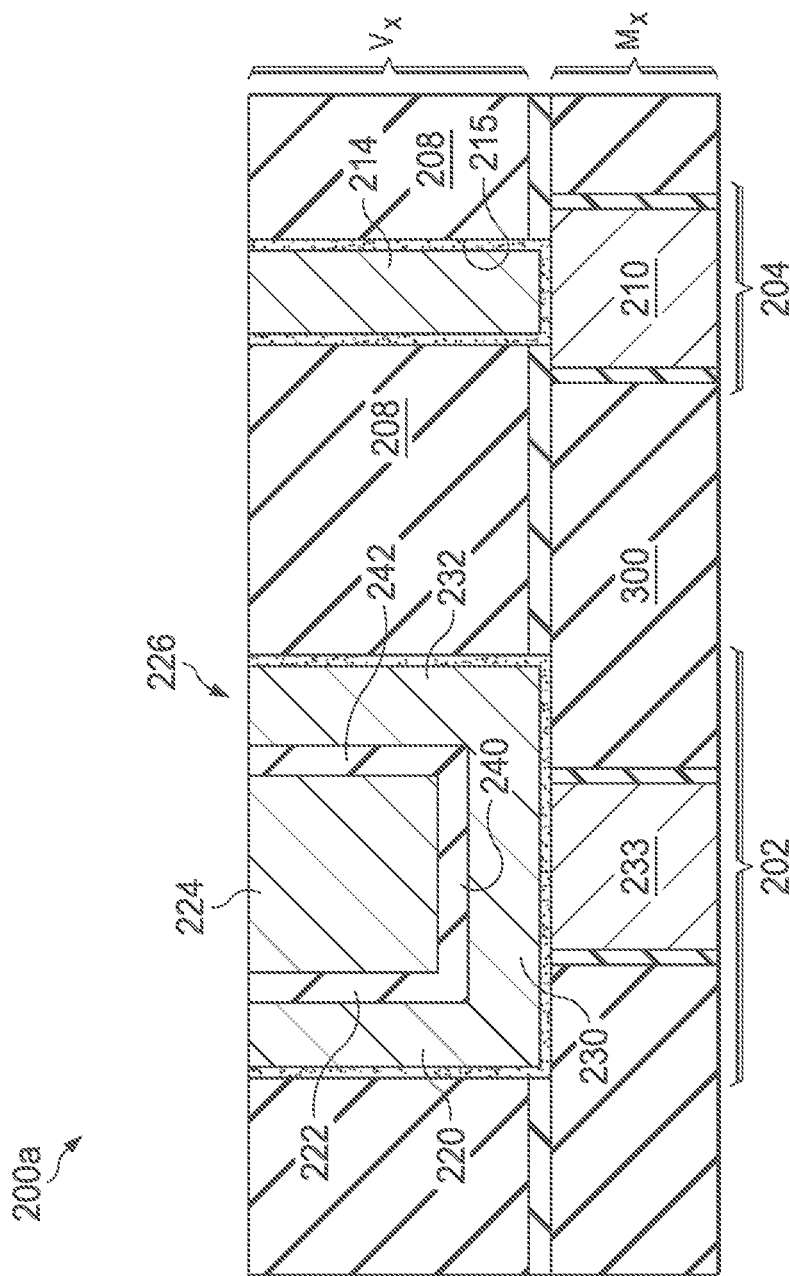

Next, as shown in FIG. 3E, a chemical mechanical planarization (CMP) process may be performed to remove portions of the conformal metal layer 312, insulator layer 320, and top electrode layer 330 above the tub opening 229 and interconnect via opening 215, leaving the cup-shaped bottom electrode 220, the cup-shaped insulator 222, and the top electrode 224 in the tub opening 229. The CMP process effectively planarizes the top surfaces of the cup-shaped bottom electrode 220, cup-shaped insulator 222, top electrode 224, via 214 and surrounding dielectric region 208.

The cup-shaped bottom electrode 220, the cup-shaped insulator 222, and the top electrode 224 collectively define the MIM CBRAM structure 226. According to the process described above, the MIM CBRAM structure 226 is thus formed by a damascene process including (a) depositing the conformal metal layer 312, insulator layer 320, and top electrode layer 330 over the IMD region 208 and extending down into the tub opening 229, and (b) a CMP process to remove the portions of the conformal metal layer 312, insulator layer 320, and top electrode layer 330 outside (above) the tub opening 229. The CMP process is suitable for a wide variety of electrode materials, including for example W, $WO_3$, $Al_2O_3$, TiW, or Cu, without limitation.

Forming the MIM CBRAM structure 226 using such a damascene process—referred to herein as a "damascene integration"—allows the CBRAM cell 202 to be formed without a metal etch, which may be advantageous as compared with other processes for forming an MIM CBRAM structure that require one or more metal etch. For example, during a plasma etch (a common metal etch), certain exotic materials such as $GeS_2$ and silver do not form a volatile by-product (i.e., a removable gas by-product) in the plasma etch chamber, resulting in a solid by-product remaining in the etch chamber, which can be problematic due to particle generation and degradation of etch chamber performance (e.g., etch rate, within wafer non-uniformity, and selectivity). The damascene integration disclosed above allows the use of exotic materials such as $GeS_2$ and silver in the CBRAM cell 202 (e.g., a $GeS_2$ for insulator layer 320 forming cup-shaped insulator 222 and silver for top electrode layer 330 forming top electrode 224) while avoiding the problems associated with etching such materials.

Figure 3F:
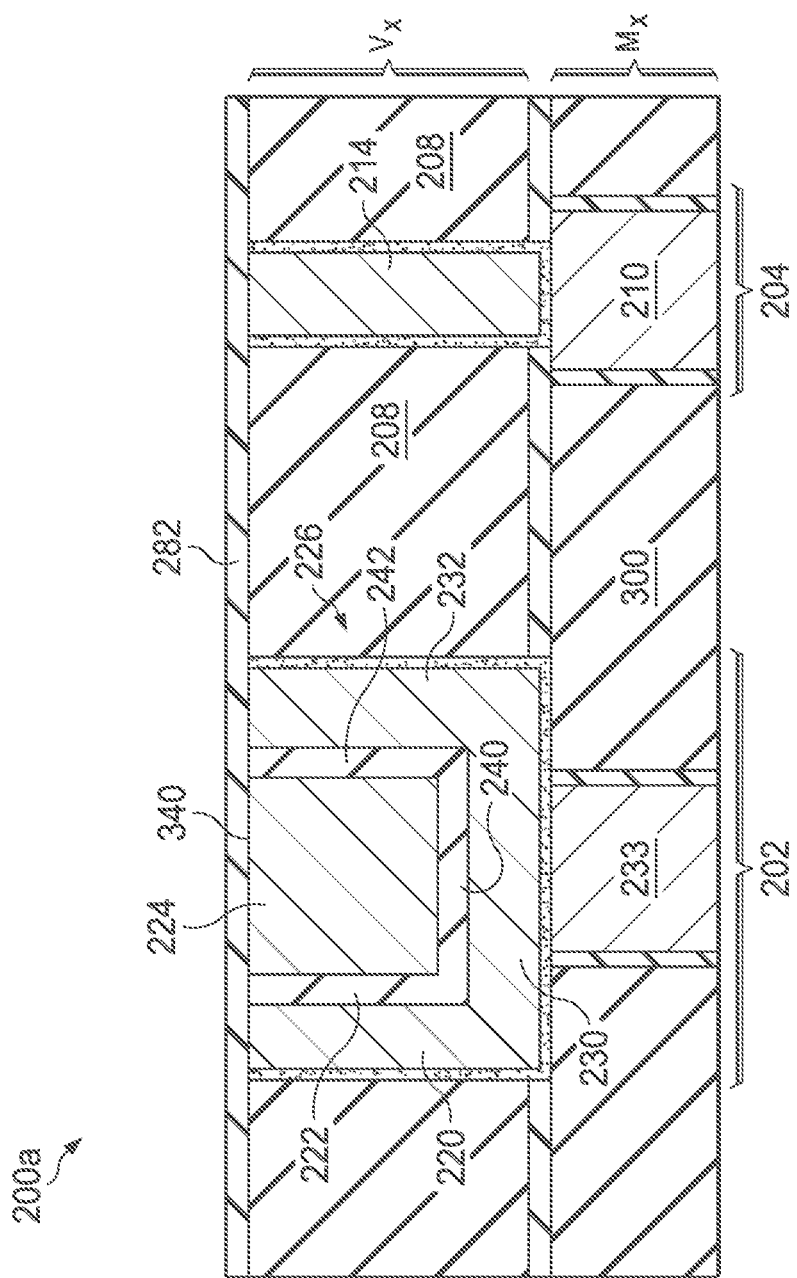

Next, as shown in FIG. 3F, a diffusion barrier layer 282 may be deposited on the integrated circuit structure 200a. In some examples, the diffusion barrier layer 282 may comprise a dielectric material such as silicon nitride (SiN) or silicon carbide (SiC) with a thickness in the range of 300-1000 Å, for example in the range of 400-600 Å. The diffusion barrier layer 282 fully encloses the exposed top surface 340 of the top electrode 224, which reduces diffusion from the top electrode 224. Example materials forming top electrode 224 such as silver and copper diffuse rapidly into nearby dielectric regions, especially in the presence of an electric field, which can be detrimental to the performance of the CBRAM cell 200a as well as nearby transistors. Thus, fully enclosing the exposed top surface 340 of the top electrode 224 by the diffusion barrier layer 282 may reduce metal diffusion and thus improve device reliability.

In addition, in some examples the diffusion barrier layer 282 also acts as an etch stop layer for a damascene trench etch (e.g., Cu trench etch) during formation of overlying metal structures, as discussed below.

Figure 3G:
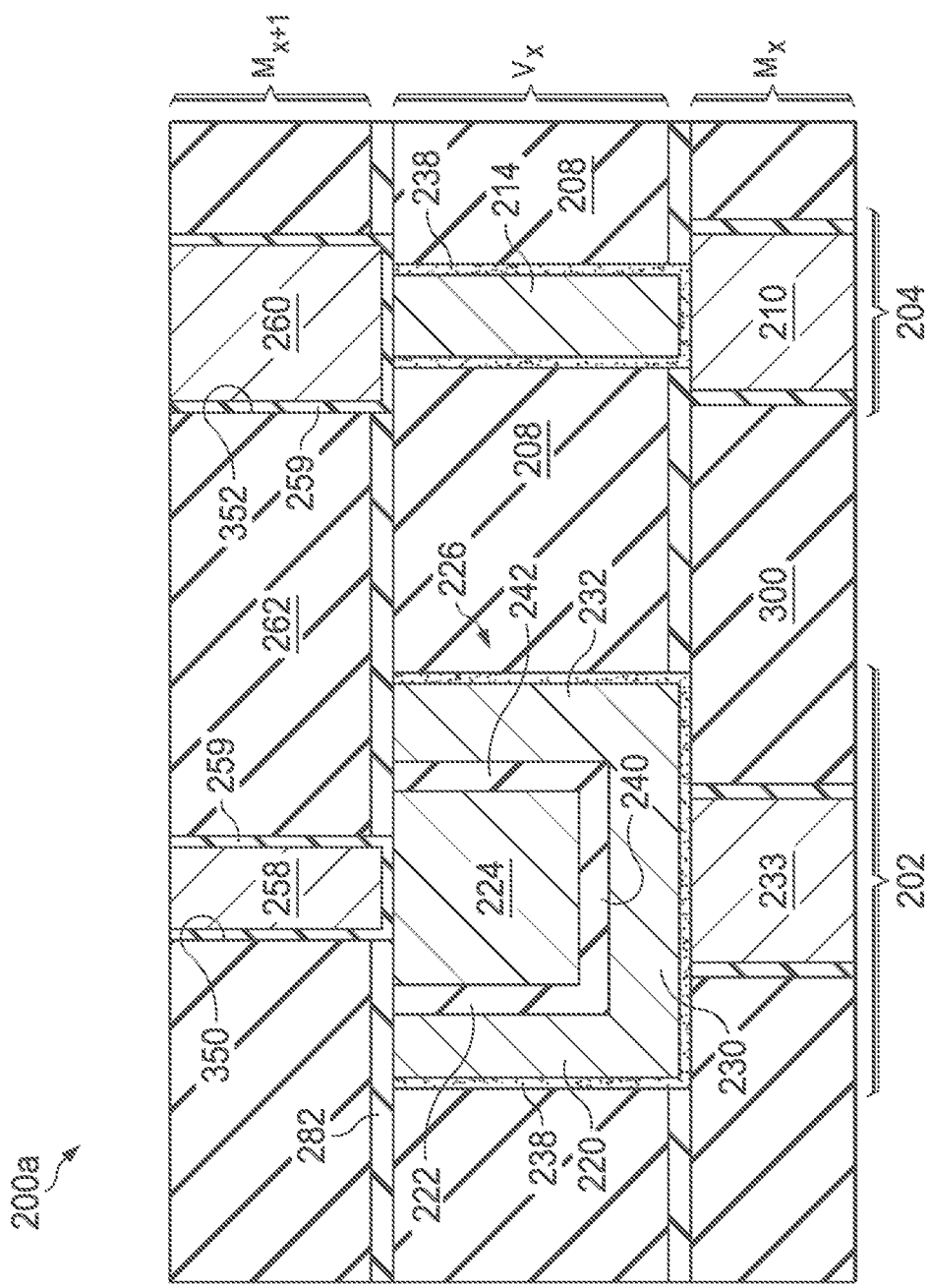

Next, as shown in FIG. 3G, the upper metal layer $M_{x+1}$, including the top electrode contact 258 and upper interconnect element 260, is formed above the via layer $V_x$ including via 214 and MIM CBRAM structure 226, e.g., by a damascene process. In one example, upper metal layer $M_{x+1}$ comprises a copper interconnect layer formed by a copper damascene process.

To form the upper metal layer $M_{x+1}$, a dielectric layer 262 is first deposited over the diffusion barrier layer 282. In some examples, the dielectric layer 262 may comprise silicon oxide, FSG (FluoroSilicate Glass), OSG (OrganoSilicate Glass), or porous OSG. The dielectric layer 262 may be patterned and etched to form a top electrode contact opening 350 above the top electrode 224, and an interconnect opening 352 (e.g., trench opening) above the via 214, with the etch proceeding through diffusion barrier layer 282 through top electrode contact opening 350 and interconnect opening 352. A barrier layer (e.g., a TaN/Ta bilayer) indicated at 259 and a copper seed layer may be deposited over the dielectric layer 262 and extending down into the etched top electrode contact opening 350 and interconnect opening 352. A copper plating process may then be performed, which fills the top electrode contact opening 350 and interconnect opening 352 with copper. A copper anneal may be performed, followed by a copper CMP process to remove portions of the copper above the dielectric layer openings 350 and 352, thereby defining the top electrode contact 258 in electrical contact with the CBRAM top electrode 224, and an upper interconnect element 260 in electrical contact with the via 214.

After forming the upper metal layer $M_{x+1}$ as discussed above, the process may continue to construct additional interconnect structures, e.g., by constructing additional metal layers separated by respective dielectric layers.

FIG. 4 shows an example integrated circuit structure 400 including the example CBRAM cell 402 and an interconnect structure 404. Unlike the example shown in FIGS. 2A and 2B in which the CBRAM cell 202 is formed between two adjacent metal interconnect layers $M_x$ and $M_{x+1}$, in the example shown in FIG. 4 the CBRAM cell 402 is formed between (a) a silicided active region $M_0$ (i.e., $M_x$ where x=0) including silicided structures (e.g., silicided transistor components) and (b) a first metal interconnect layer $M_1$ (i.e., $M_{x+1}$ where x=0), often referred to as Metal-1.

As shown in FIG. 4, the silicided active region $M_0$ includes a metal-oxide-semiconductor field-effect transistor (MOSFET) 406 formed on a silicon substrate 408. The MOSFET 406 may include a polysilicon gate 410 formed over and separated from the silicon substrate 408 by gate oxide layer 412, and a doped source region 414 and doped drain region 416 formed in the silicon substrate 408. In this example, the polysilicon gate 410 and the doped drain region 416 comprise silicided structures 420. In particular, a metal silicide layer 424 is formed on a top surface of the polysilicon gate 410, and a metal silicide layer 426 is formed on a top surface of doped drain region 416. Metal silicide layers 424 and 426 may comprise any suitable metal silicide layer, for example titanium silicide (TiSi2), cobalt silicide (CoSi2), or nickel silicide (NiSi), having a thickness in the range of 100-300 Å or other suitable thickness. For the purposes of the present disclosure, metal silicide layers 424 and 426 define metal structures, such that the silicided active region $M_0$ can be considered as a metal layer.

In the example shown in FIG. 4, the MIM CBRAM structure 226 is formed on the metal silicide layer 426 on top of the doped drain region 416 to provide a conductive connection between the MIM CBRAM structure 226 and the doped drain region 416. The MIM CBRAM structure 226 is contacted from above by the top electrode contact 258, as discussed above. Further, the via 214 (also referred to as a contact) is formed on the metal silicide layer 424 on top of the polysilicon gate 410 to provide conductive connection between the polysilicon gate 410 and the upper interconnect element 260. The top electrode contact 258 and upper interconnect element 260 comprise metal elements formed in the first metal interconnect layer $M_1$, e.g., by a damascene process.

Figure 5A:
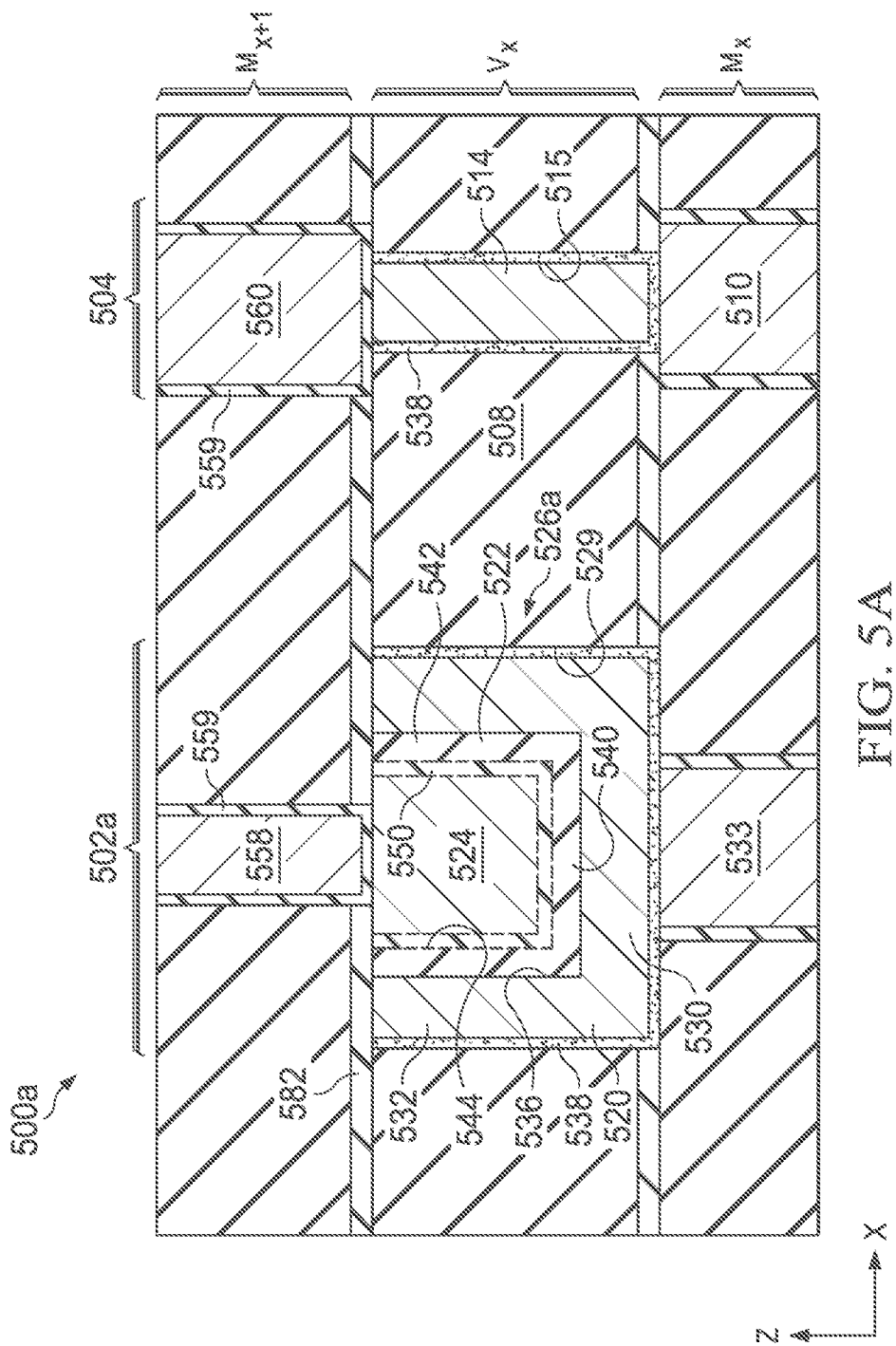
FIG. 5A shows an example integrated circuit structure including an example OxRRAM cell and nearby interconnect structure, wherein the bottom electrode of the OxRRAM cell is formed as a single layer.
Figure 5B:
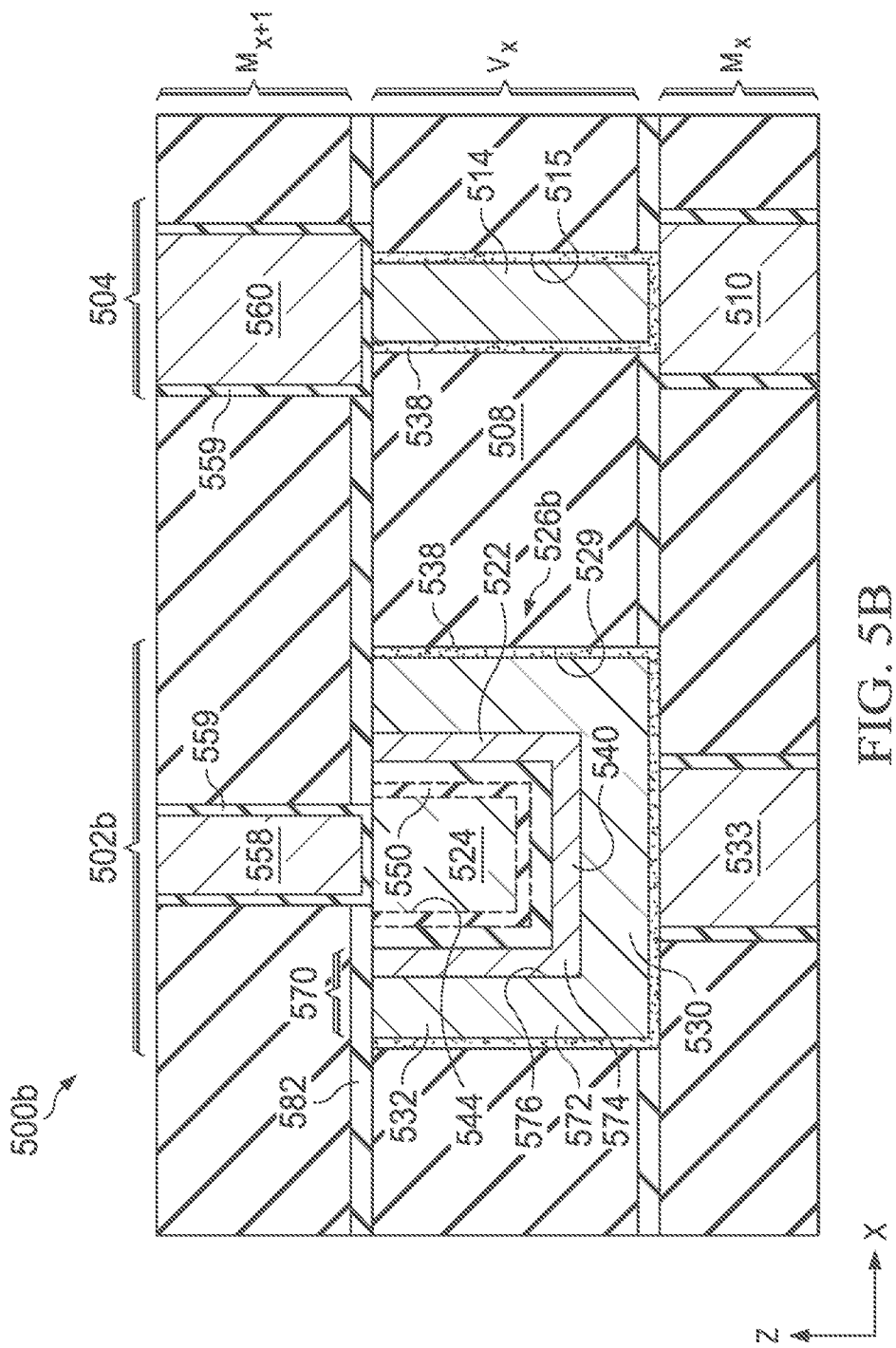
FIG. 5B shows an example integrated circuit structure including an example OxRRAM cell and nearby interconnect structure, wherein the bottom electrode of the OxRRAM cell is formed as a multi-layer structure.

Other embodiments provide an OxRRAM cell formed by a process similar to the process for CBRAM cell 200a discussed above. For example, an OxRRAM cell may include a cup-shaped metal-insulator-metal (MIM) structure formed in a via layer between adjacent metal interconnect layers or between a silicided active region (e.g., including MOSFET transistors) and a metal-1 interconnect layer. The MIM structure of the OxRRAM cell may include a cup-shaped bottom electrode, an insulator/electrolyte layer, an optional insulator cap layer, and a top electrode, all formed in a tub opening in the via layer. In some examples, the cup-shaped bottom electrode may be formed simultaneously with vias in the via layer, e.g., by a conformal tungsten deposition, as shown in FIGS. 5A and 5B discussed below. In other examples, the cup-shaped bottom electrode comprises at least two layers, e.g., (a) a cup-shaped bottom electrode outer component and (b) a cup-shaped bottom electrode inner component on which the insulator/electrolyte layer is formed. The cup-shaped bottom electrode outer component may be formed simultaneously with the vias, followed by deposition of the cup-shaped bottom electrode inner component on the cup-shaped bottom electrode outer component. This allows the cup-shaped bottom electrode inner component, which is in contact with the insulator/electrolyte layer, to be formed from a different material (e.g., platinum) than the vias (e.g., tungsten).

FIGS. 5A and 5B show two example OxRRAM cells 502a and 502b, respectively, including a cup-shaped MIM OXRRAM structure formed by a damascene process (damascene integration). The example OxRRAM cell 502a shown in FIG. 5A is formed by a process similar to the example CBRAM cell 202 discussed above. In contrast, the example OxRRAM cell 502b shown in FIG. 5B includes a multi-layered cup-shaped bottom electrode including a bottom electrode outer component and a bottom electrode inner component, as discussed above.

Turning first to FIG. 5A, an example integrated circuit structure 500a includes the example OxRRAM cell 502a and the interconnect structure 504. The OxRRAM cell 502a comprises an MIM OxRRAM structure 526a formed between a lower metal layer $M_x$ and an upper layer $M_{x+1}$. In the example shown in FIG. 5A (and FIGS. 6A-6G discussed below), the lower metal layer $M_x$ and an upper layer $M_{x+1}$ are two adjacent metal interconnect layers, such that the OxRRAM cell 502a is formed in a via layer $V_x$ between the two adjacent metal interconnect layers $M_x$ and $M_{x+1}$. In other examples, as discussed above in relation to FIG. 4, the OxRRAM cell 502a is formed in a via layer $V_x$ between a silicided active region (including silicon-based transistors including silicided transistor structures) $M_0$ and a first metal interconnect layer $M_1$ (often referred to as Metal-1). Via layer $V_x$ may comprise various conductive structures formed in an IMD region 508, e.g., an oxide region.

The interconnect structure 504 may include a lower interconnect element 510 formed in a lower metal layer $M_x$ (for example, where x=0 for a silicided active layer as discussed above) and an upper interconnect element 560, e.g., metal-1 layer, formed in an upper metal layer $M_{x+1}$ and connected to the lower interconnect element 510 by at least one interconnect via 514 formed in via layer $V_x$ by depositing a conformal metal, e.g., tungsten, cobalt or aluminum, into respective via openings 515. Each of the lower interconnect element 510 and upper interconnect element 560 may comprise a wire or other laterally elongated structure (e.g., elongated in the y-axis direction), or a discrete pad (e.g., having a square, circular, or substantially square or circular shape in the x-y plane), or any other suitable shape and structure.

The MIM OxRRAM structure 526a is formed in a tub opening 529 in the via layer $V_x$. The MIM OxRRAM structure 526a includes a cup-shaped bottom electrode 520, a cup-shaped insulator 522 formed on the cup-shaped bottom electrode 520, and a top electrode 524 formed in an interior opening defined by the cup-shaped insulator 522. The cup-shaped bottom electrode 520 includes (a) a laterally-extending bottom electrode base 530 in electrical contact with a metal interconnect element 533 underlying bottom electrode base 530, and (b) multiple vertically-extending bottom electrode sidewalls 532 extending upwardly from the laterally-extending bottom electrode base 530.

The cup-shaped bottom electrode 520 may be formed concurrently with the via 514 by depositing a conformal metal, e.g., tungsten, cobalt or aluminum, into the tub opening 529 and via opening 515 in via layer $V_x$. In some example, a glue layer 538, e.g., comprising titanium nitride (TiN), is deposited in the tub opening 529 and via opening 515 prior to the conformal metal, to improve adhesion between the conformal metal and IMD region 508.

In one example, the bottom electrode base 530 may have a rectangular perimeter (e.g., having a square or non-square rectangular shape) defining four lateral sides when viewed from above, with four vertically-extending bottom electrode sidewalls 532 extending upwardly from the four lateral sides of the rectangular perimeter. The cup-shaped bottom electrode 520 may include any other number of vertically-extending bottom electrode sidewalls 532 extending upwardly from the bottom electrode base 530.

The laterally-extending bottom electrode base 530 and vertically-extending bottom electrode sidewalls 532 define an interior opening 536 of the cup-shaped bottom electrode 520. As shown, the cup-shaped insulator 522 is formed in the interior opening 536 defined by the cup-shaped bottom electrode 520 and includes a laterally-extending insulator base 540, formed over the bottom electrode base 530, and multiple vertically-extending insulator sidewalls 542 extending upwardly from the laterally-extending insulator base 540, with each vertically-extending insulator sidewall 542 formed on (laterally adjacent) a respective bottom electrode sidewall 532. In some examples, the cup-shaped insulator 522 may comprise an insulating material such as $Al_2O_3$, $Ta_2O_5$, $ZrO_2$, $HfO_2$, or other oxide, and may be deposited by chemical vapor deposition (CVD), atomic layer deposition (ALD) or other suitable process. In some examples, the cup-shaped insulator 522 may have a thickness in the range of 300-1000 Å, for example in the range of 400-600 Å.

The laterally-extending insulator base 540 and vertically-extending insulator sidewalls 542 define an interior opening 544. The top electrode 524 is formed inside and fills the interior opening 544 defined by the cup-shaped insulator 522. The top electrode 524 may comprise silver (Ag), copper (Cu), platinum (Pt), or other suitable metal.

In some examples, an optional insulator cap layer 550 comprising a dielectric or metallic layer may be formed between the cup-shaped insulator 522 and the top electrode 524. In some embodiments, the insulator cap layer 550 may comprise a layer of material such as $Al_2O_3$, $Ta_2O_5$, $ZrO_2$, $HfO_2$, Ti, or TiN, and may be deposited by CVD, PVD, or ALD methods with a layer thickness in the range of 50-200 Å, for example. The addition of the optional insulator cap layer 550 provides improved control over the performance of the resulting OxRRAM cell 502, such as reducing leakage current, which may improve the speed or reliability of resistive switching in the OxRRAM cell 502.

A diffusion barrier layer 582 may be formed over the MIM OxRRAM structure 526a to provide a barrier against diffusion from the top electrode 524 (e.g., silver diffusion). In some examples, the diffusion barrier layer 282 may comprise a dielectric material such as silicon nitride (SiN), silicon carbide (SiC), or a high-k dielectric material (e.g., having a dielectric constant above 7). In addition to providing a diffusion barrier, the diffusion barrier layer 582 may act as an etch stop during construction of the upper metal layer $M_{x+1}$, e.g., during a damascene etch for creating damascene metal elements in upper metal layer $M_{x+1}$. The diffusion barrier layer 582 may also provide an effective termination layer for the edge electric field of the OxRRAM cell 502 to improve the breakdown voltage of the OxRRAM cell 502.

The upper metal layer ($M_{x+1}$) formed over the via layer $V_x$ (including interconnect via 514 and MIM OxRRAM structure 526a) includes a top electrode contact 558 in electrical contact with the OxRRAM top electrode 524 and an upper interconnect element 560 in electrical contact with the interconnect via 514. In some embodiments, the top electrode contact 558 and upper interconnect element 560 comprise damascene elements formed by a damascene process, e.g., using copper, tungsten, or aluminum. For example, top electrode contact 558 and upper interconnect element 560 may comprise copper damascene elements formed over a barrier layer 559, e.g., a TaN/Ta bilayer.

Each of the top electrode contact 558 and upper interconnect element 560 may comprise a wire or other laterally elongated structure (e.g., elongated in the y-axis direction), or a discrete pad (e.g., having a square, circular, or substantially square or circular shape in the x-y plane), or any other suitable shape and structure.

The example OxRRAM cell 502a may be formed by a process similar to the process for the example CBRAM cell 202 shown in FIGS. 3A-3G, but using different materials for one or more components, for example the cup-shaped bottom electrode 520, cup-shaped insulator 522, and/or top electrode 524.

As discussed above, in other examples the cup-shaped bottom electrode has a multi-layer construction, e.g., including a cup-shaped bottom electrode outer component formed concurrently with interconnect vias, followed by a cup-shaped bottom electrode inner component formed on the cup-shaped bottom electrode outer component. As noted above, this allows the cup-shaped bottom electrode inner component (which is in contact with the insulation layer of the OxRRAM cell) to be formed from a different material (e.g., platinum) than the interconnect vias (e.g., tungsten).

FIG. 5B shows an example integrated circuit structure 500a including an example OxRRAM cell 502b, having an MIM structure 526a, and an interconnect structure 504. The MIM structure 526b is similar to the MIM structure 526a of the OxRRAM cell 502a shown in FIG. 5A, but includes a multi-layer cup-shaped bottom electrode 570. As discussed above, the multi-layer cup-shaped bottom electrode 570 may include (a) a cup-shaped bottom electrode outer component 572, which may be formed concurrently with the via 514 in the via layer $V_x$ (e.g., by depositing tungsten, cobalt, or other conformal metal into the tub opening 529 and via opening 515) and (b) a cup-shaped bottom electrode inner component 574 formed by depositing a different conformal metal, e.g., platinum, into an interior opening 576 defined by the cup-shaped bottom electrode outer component 572.

As with the CBRAM cell 202 and OxRRAM cell 502a discussed above, the OxRRAM cell 502b may be formed between two adjacent metal interconnect layers $M_x$ and an upper layer $M_{x+1}$, or between a silicided active region $M_0$ including silicided structures and a metal-1 interconnect layer $M_1$.

Figure 6A:
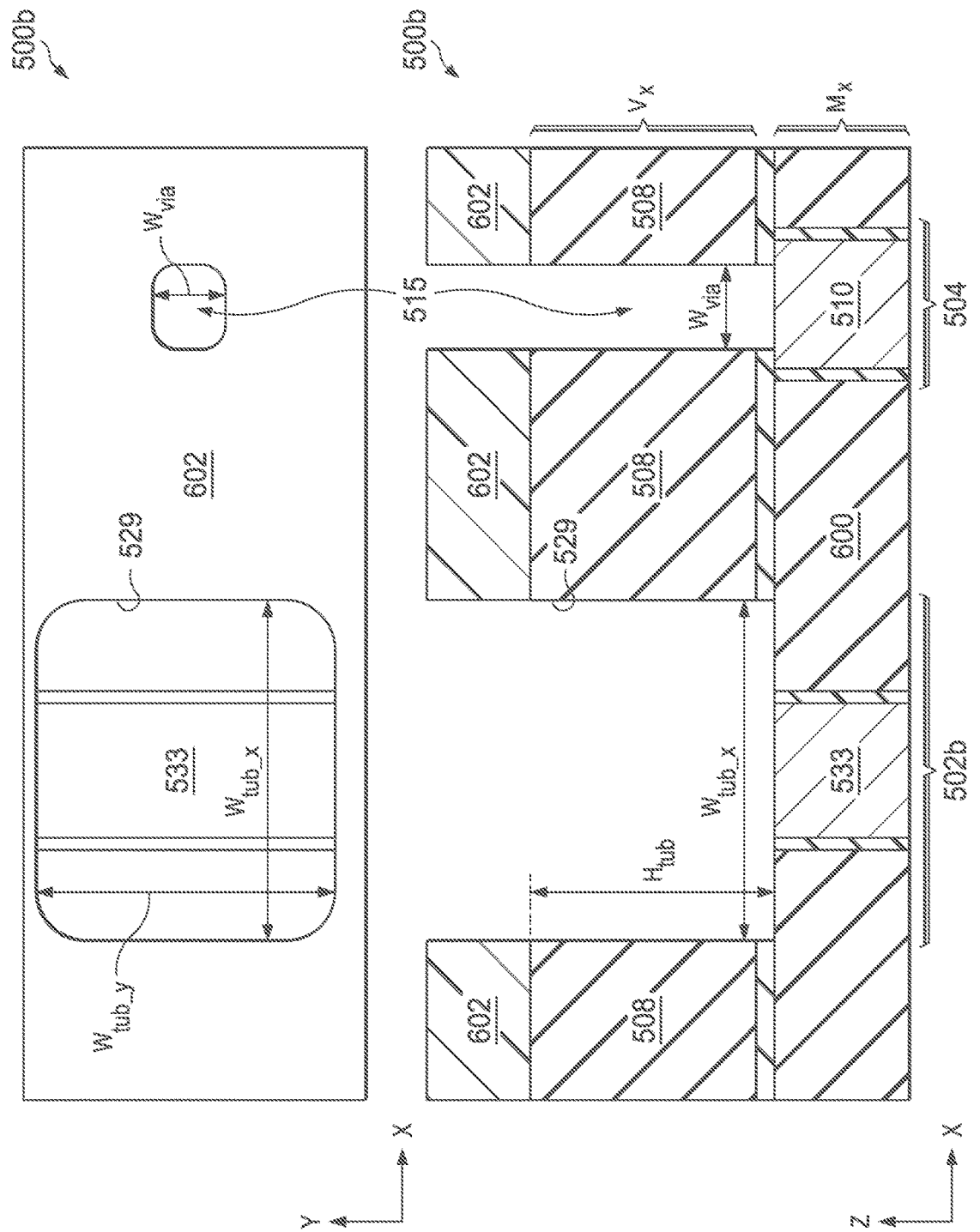
FIGS. 6A-6G illustrate an example process for forming the integrated circuit structure shown in FIG. 5B, including the example OxRRAM cell formed with a multi-layer bottom electrode.

First, as shown in FIG. 6A, which includes a top view (x-y plane) and a side cross-sectional via (x-z plane) of the integrated circuit structure 500b being formed, an IMD region 508, e.g., comprising an oxide, is formed over a lower metal layer $M_x$ including lower interconnect elements 510 and 533, similar to lower interconnect elements 210 and 233 discussed above.

A photoresist layer 602 may be deposited and patterned to form photoresist openings, and the underlying IMD region 208 is etched through the photoresist openings to form tub opening 529 for the OxRRAM cell formation and via opening 515 in the IMD region 508. Via opening 515 may have a square, circular, or other suitable shape from a top view (x-y plane), with a width (or diameter or critical dimension (CD)) $W_{via}$ in both the x-direction and y-direction in the range of 0.1-0.35 μm, or for example. In contrast, the tub opening 529 may have a substantially greater width $W_{tub}$ in each of the x-direction $W_{tub\_x}$ and y-direction $W_{tub\_y}$ than width $W_{via}$ of via opening 515. The shape and dimensions of the tub opening 529 may be selected based on various parameters, e.g., for effective manufacturing of the MIM OxRRAM structure 526b and/or for desired performance characteristics of the resulting OxRRAM cell 502b. In one example, the tub opening 529 may have a square or rectangular shape in the x-y plane. In other examples, tub opening 529 may have a circular or oval shape in the x-y plane.

The details of the tub opening 529, including the shape in the x-y plane, the dimensions (e.g., $W_{tub\_x}$ and/or $W_{tub\_y}$), and the height-to-width aspect ratio ($H_{tub}/W_{tub\_x}$ and/or $H_{tub}/W_{tub\_y}$) may be the same or similar to the corresponding details of the tub opening 229 discussed above.

Figure 6B:
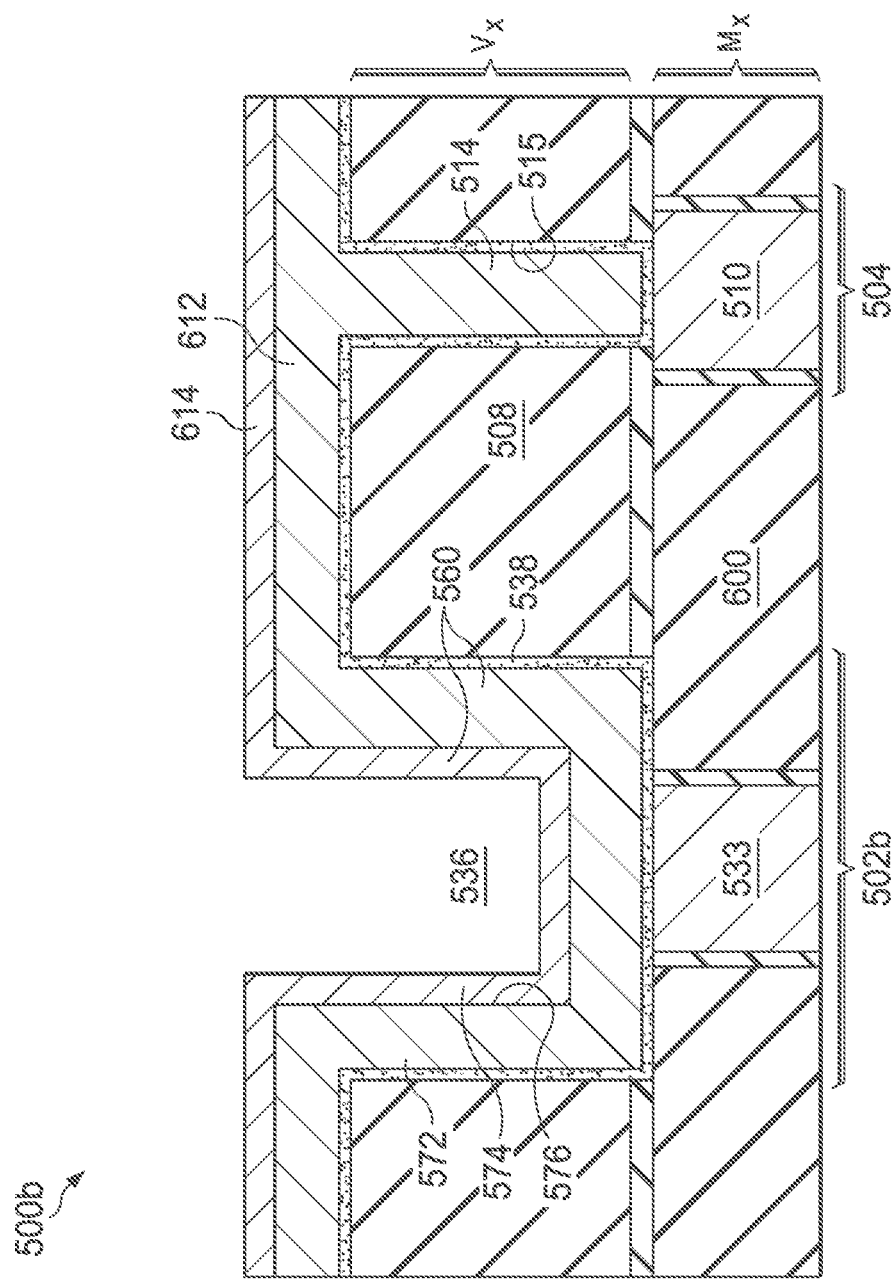

Next, as shown in FIG. 6B, a glue layer 538, e.g., comprising TiN, is deposited over the IMD region 508 and extends down into the tub opening 529 and via opening 515, e.g., similar to glue layer 238 discussed above.

A first conformal metal layer 612 is then deposited over the glue layer 538 and extends down into the tub opening 529 and via opening 515. As shown, the deposited first conformal metal layer 612 (a) fills interconnect via opening 515 to form the interconnect via 514 and (b) covers the interior surfaces of the tub opening 529 to form the cup-shaped bottom electrode outer component 572 defining the interior opening 576 defined by the cup-shaped bottom electrode outer component 572. In one example, the first conformal metal layer 612 comprises tungsten deposited with a thickness in the range of 1000-5000 Å. In other examples, the first conformal metal layer 612 comprises cobalt, aluminum, or other conformal metal. The first conformal metal layer 612 may be deposited by a conformal CVD process or other suitable deposition process. The glue layer 538 may increase or enhance an adhesion of the first conformal metal layer 612 to the interior surfaces of the tub opening 529 to facilitate the formation of the cup-shaped bottom electrode outer component 572.

After depositing the first conformal metal layer 612, a second conformal metal layer 614 is then deposited over the first conformal metal layer 612 and extends down into the tub opening 529 to form the cup-shaped bottom electrode inner component 574 defining an interior opening 536. As noted above, the second conformal metal layer 614 may comprise a different metal than the first conformal metal layer 612. For example, the second conformal metal layer 614 may comprise platinum deposited by sputtering to a thickness in the range of 1000 Å-3000 Å.

Figure 6C:
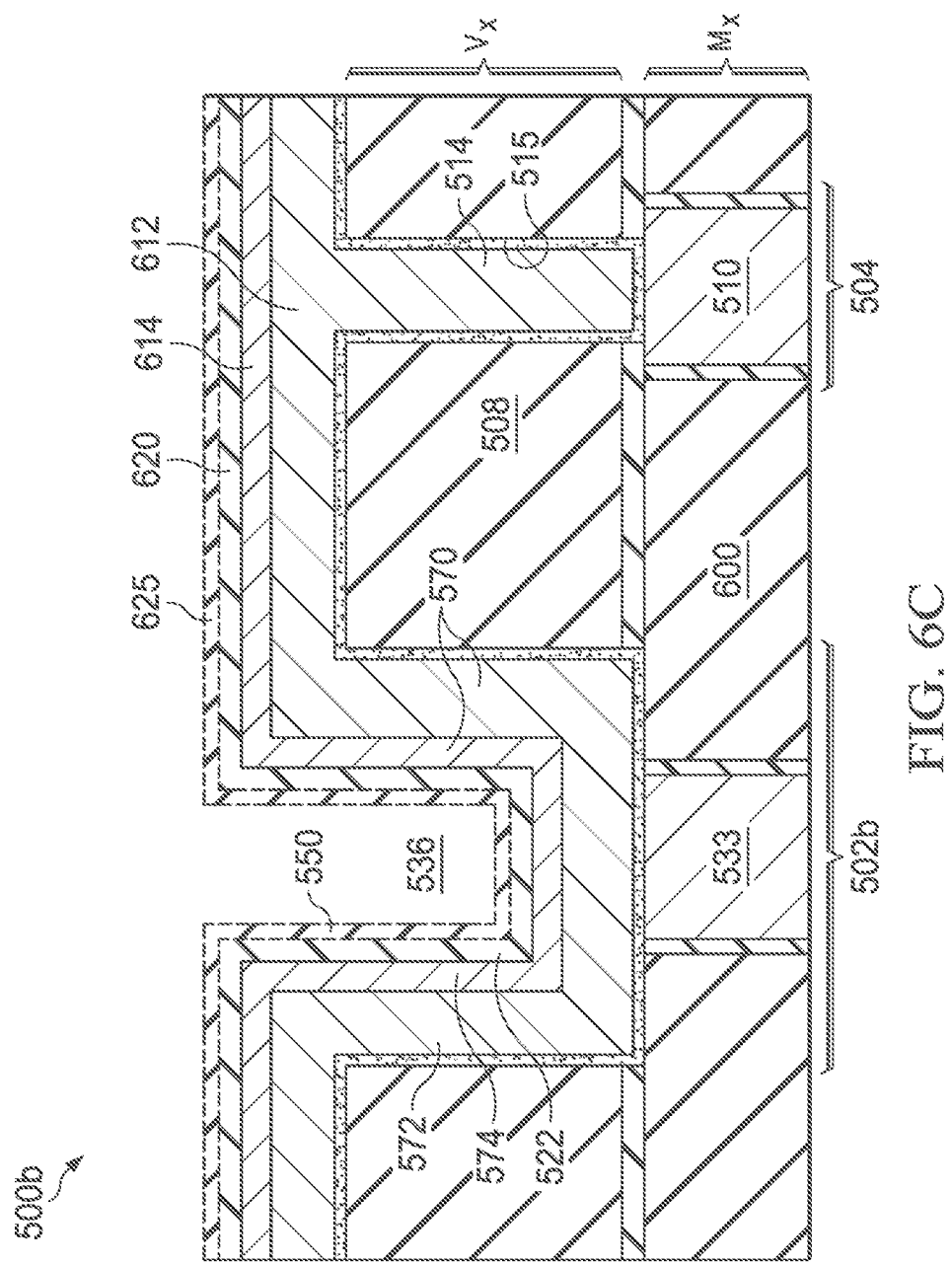

Next, as shown in FIG. 6C, an insulator layer 620 is deposited or formed over the second conformal metal layer 614 and extends down into the interior opening 536 of the cup-shaped bottom electrode inner component 574 to define the cup-shaped insulator 522. In some examples, the insulator layer 620 may comprise $Al_2O_3$, $Ta_2O_5$, $ZrO_2$, $HfO_2$, or other oxide, and may be deposited by a CVD or PVD process In some examples, the insulator layer 620 may have a thickness in the range of 300-1000 Å, for example in the range of 400-600 Å.

As discussed above, in some examples an optional insulator cap layer 625 may be formed over the insulator layer 620 and extending down into the tub opening 529 to define an insulator cap 550. In some embodiments, the insulator cap layer 550 may comprise materials such as $Al_2O_3$, $Ta_2O_5$, $ZrO_2$, $HfO_2$, Ti, or TiN, and may be deposited by CVD, PVD, or ALD methods with a layer thickness in the range of 50-200 Å, for example.

Figure 6D:
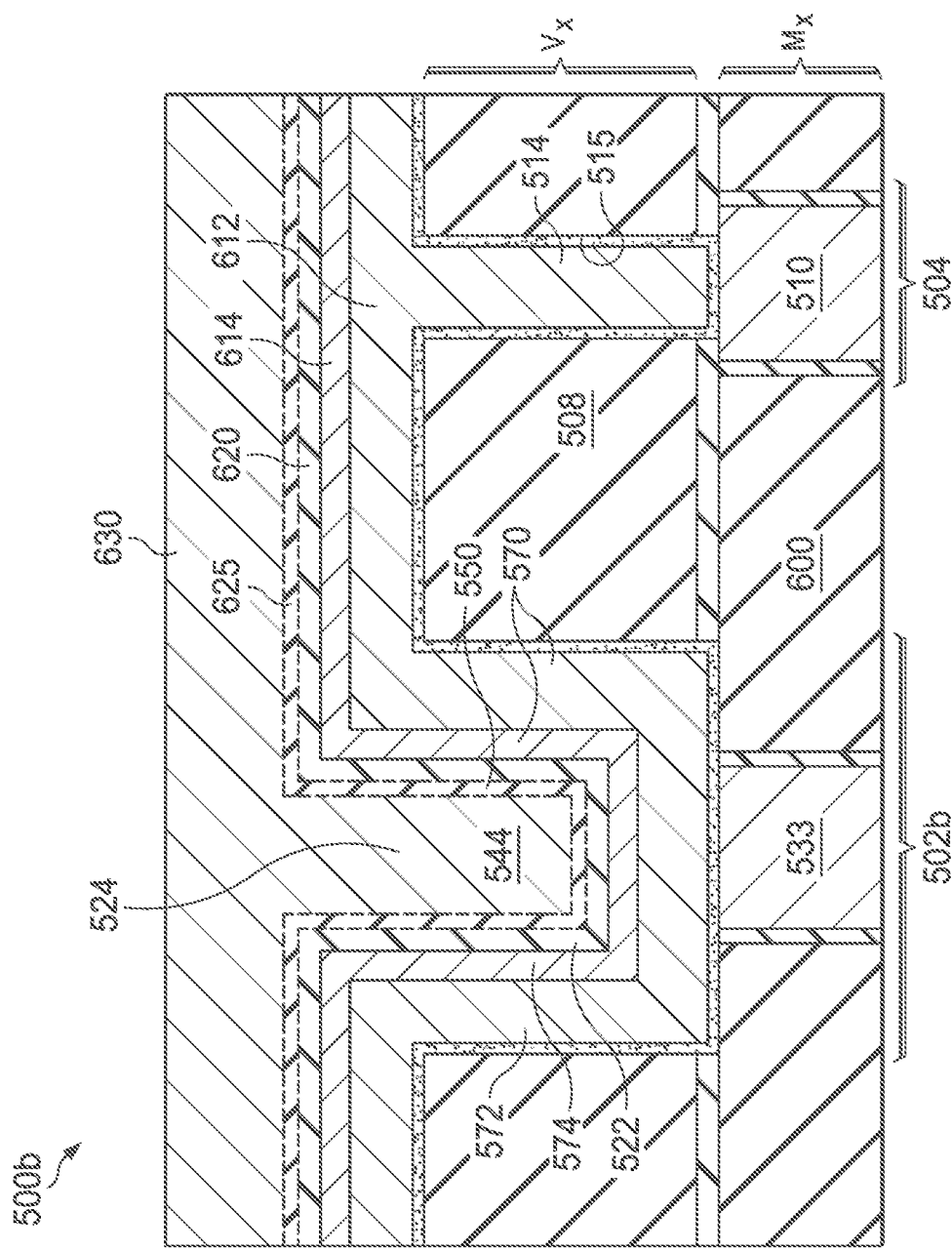

Next, as shown in FIG. 6D, a top electrode layer 630 may be deposited over the insulator layer 620, or over the optional insulator cap layer 625 (if present), and extending down into an interior opening 544 defined by the cup-shaped insulator 522 (or insulator cap 550), to define the top electrode 524. The top electrode layer 630 may comprise silver, copper, platinum, or other suitable electrode material, and may be deposited by a PVD process and with a sufficient thickness to fill the cup-shaped insulator interior opening 544.

Figure 6E:
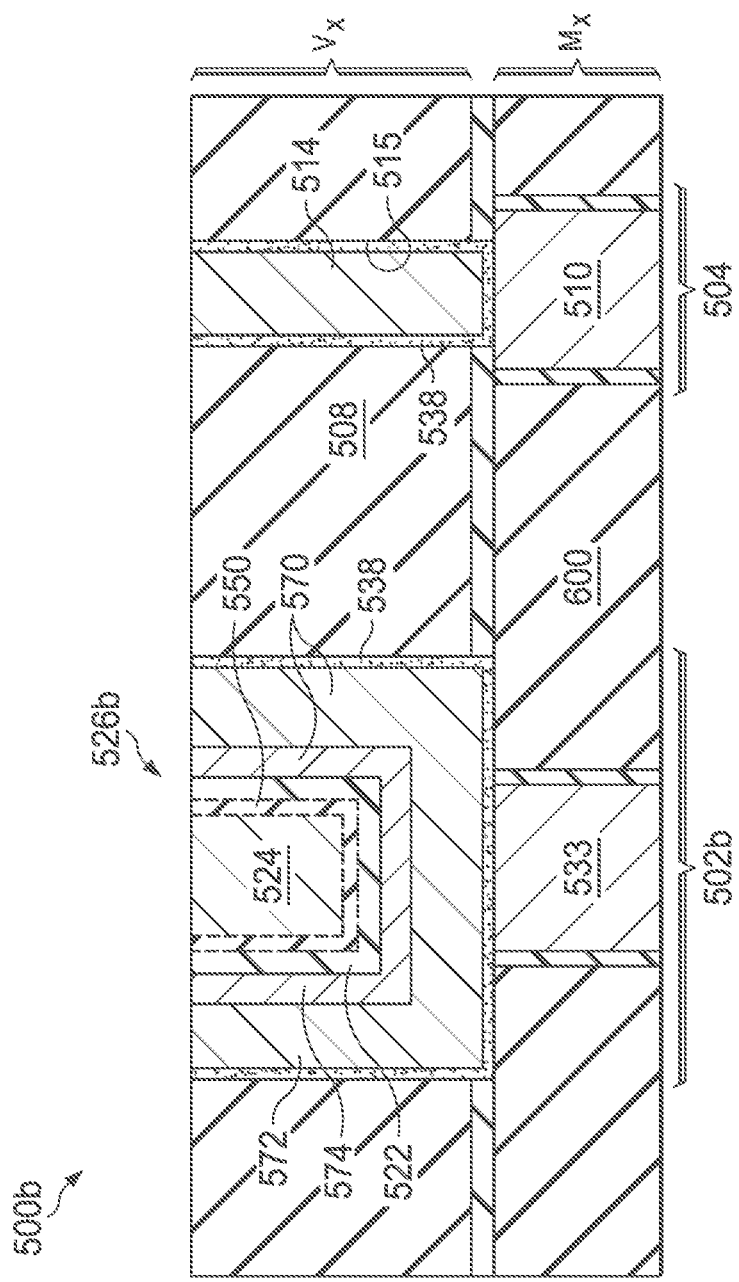

Next, as shown in FIG. 6E, a chemical mechanical planarization (CMP) process may be performed to remove portions of the conformal metal layer 612, insulator layer 620, optional insulator cap layer 625, and top electrode layer 630 above the tub opening 529 and interconnect via opening 515, leaving the cup-shaped bottom electrode 520, the cup-shaped insulator 522, the optional insulator cap 550, and the top electrode 524 in the tub opening 529. The CMP process effectively planarizes the top surfaces of the cup-shaped bottom electrode components 572 and 574, cup-shaped insulator 522, optional insulator cap 550, top electrode 524, and surrounding IMD region 508.

The cup-shaped bottom electrode components 572 and 574, the cup-shaped insulator 522, the optional insulator cap 550, and the top electrode 524 collectively define the MIM OxRRAIV1 structure 526b. According to the process described above, the MIM OxRRAM structure 526b is thus formed by a damascene process including (a) depositing the first conformal metal layer 612, second conformal metal layer 614, insulator layer 620, optional insulator cap layer 625, and top electrode layer 630 over the IMD region 508 and extending down into the tub opening 529, and (b) a CMP process to remove the portions of the first conformal metal layer 612, second conformal metal layer 614, insulator layer 620, optional insulator cap layer 625, and top electrode layer 630 outside (above) the tub opening 529. The CMP process is suitable for a wide variety of electrode materials, including for example W, $WO_3$, $Al_2O_3$, TiW, or Cu, without limitation.

Forming the MIM OxRRAM structure 526b using such damascene integration process allows the OxRRAM cell 502b to be formed without a metal etch, which may be advantageous as compared with other processes for forming an MIM OxRRAM structure that require one or more metal etch, as explained above with respect to the MIM CBRAM structure 226.

Figure 6F:
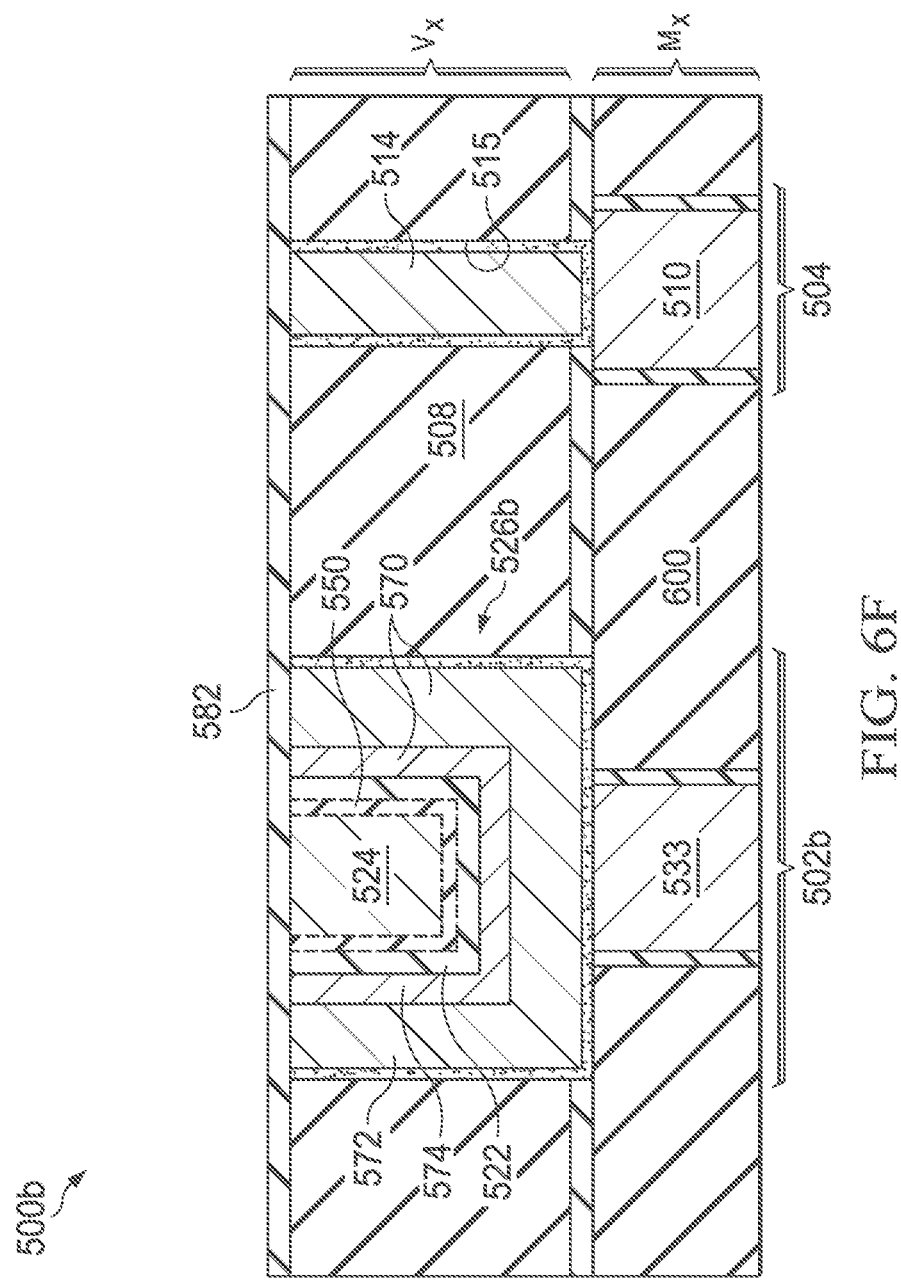

Next, as shown in FIG. 6F, a diffusion barrier layer 582 may be deposited on the structure 500b. In some examples, the diffusion barrier layer 582 may comprise a dielectric material, such as silicon nitride (SiN) or silicon carbide (SiC), with a thickness in the range of 300-1000 Å, for example in the range of 400-600 Å. The diffusion barrier layer 582 fully encloses the exposed top surface of the top electrode 524, which reduces diffusion from the top electrode 524. Example materials for forming top electrode 524 such as silver and copper diffuse rapidly into nearby dielectric regions, especially in the presence of an electric field, which can be detrimental to the performance of the OxRRAM cell 502b as well as nearby transistors. Thus, fully enclosing the top electrode 524 by the dielectric barrier layer 582 may reduce metal diffusion and thus improve device reliability.

In addition, in some examples the diffusion barrier layer 582 also acts as an etch stop layer for a damascene trench etch (e.g., Cu trench etch) during formation of overlying metal structures, as discussed below.

Figure 6G:
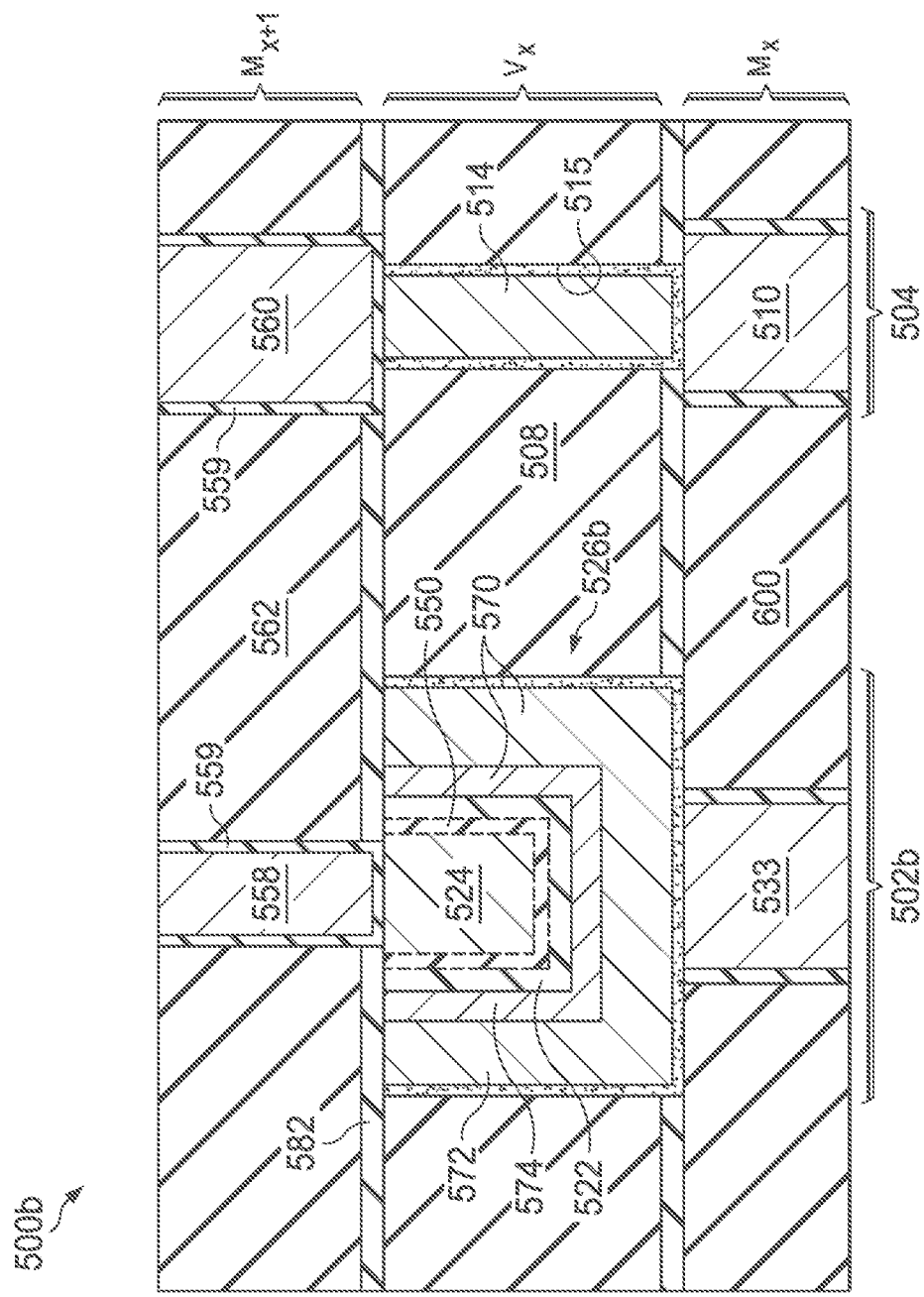

Next, as shown in FIG. 6G, the upper metal layer $M_{x+1}$, including the top electrode contact 558 and upper interconnect element 560, is formed above the via layer $V_x$ including via 514 and MIM OxRRAM structure 526b, e.g., by a damascene process. In one example, upper metal layer $M_{x+1}$ comprises a copper interconnect layer formed by a copper damascene process.

The upper metal layer $M_{x+1}$, may be formed similar to the upper metal layer $M_{x+1}$ formed over the CBRAM cell 202 as discussed above regarding FIG. 3G. For example, top electrode contact 558 and upper interconnect element 560 may be formed in a dielectric layer 562 over the dielectric diffusion barrier layer 582 by a damascene process, similar to the formation of top electrode contact 258 and upper interconnect element 260 discussed above regarding FIG. 3G. After forming the upper metal layer $M_{x+1}$, the process may continue to construct additional interconnect structures, e.g., by constructing additional metal layers separated by respective dielectric layers.

The invention claimed is:

1. An integrated circuit structure, comprising:
    a dielectric region including a tub opening;
    a resistive random access memory cell structure formed in the tub opening and including:
        a cup-shaped bottom electrode comprising:
            a cup-shaped bottom electrode outer component formed in the tub opening; and
            a cup-shaped bottom electrode inner component formed on the cup-shaped bottom electrode outer component;
            wherein the cup-shaped bottom electrode inner component is formed from a different material than the cup-shaped bottom electrode outer component;
        a cup-shaped insulator; and
        a top electrode; and
    an upper metal layer over the dielectric region and including a top electrode contact in electrical contact with the top electrode.

2. The integrated circuit structure of claim 1, wherein the resistive random access memory cell structure comprises a damascene structure.

3. The integrated circuit structure of claim 1, wherein:
    the dielectric region is formed over a lower metal layer including a lower interconnect element;
    the resistive random access memory cell structure is conductively connected between the lower interconnect element in the lower metal layer and the top electrode contact in the upper metal layer.

4. The integrated circuit structure of claim 1, comprising a via formed in a via opening in the dielectric region; and
    wherein the upper metal layer includes an interconnect element in contact with the via.

5. The integrated circuit structure of claim 1, wherein:
    the cup-shaped bottom electrode outer component comprises tungsten or cobalt; and
    the cup-shaped bottom electrode inner component comprises platinum.

6. The integrated circuit structure of claim 1, wherein the resistive random access memory cell comprises a conductive bridging random access memory cell.

7. The integrated circuit structure of claim 6, wherein the cup-shaped insulator comprises $GeS_2$, $Al_2O_3$, or $WO_3$.

8. The integrated circuit structure of claim 1, wherein the resistive random access memory cell comprises an oxygen vacancy-based resistive random access memory cell.

9. The integrated circuit structure of claim 8, wherein the cup-shaped insulator comprises $Al_2O_3$, $Ta_2O_5$, or $HfO_2$.

10. The integrated circuit structure of claim 1, comprising a cup-shaped insulator cap located between the cup-shaped insulator and the top electrode, wherein the cup-shaped insulator cap comprises a different material than the cup-shaped insulator and the top electrode.

11. An integrated integrated circuit structure, comprising:
    a dielectric region formed over a transistor, the transistor including a doped source region and a doped drain region, the dielectric region including a tub opening exposing a silicide region, the exposed silicide region formed on the source region or on the drain region of the transistor;
    a resistive random access memory cell structure formed in the tub opening and including:
        a cup-shaped bottom electrode formed on the exposed silicide region;
        a cup-shaped insulator; and
        a top electrode.

12. An integrated integrated circuit structure, comprising:
    a dielectric region including a tub opening;
    a resistive random access memory cell structure formed in the tub opening and including:
        a cup-shaped bottom electrode comprising:
            a cup-shaped bottom electrode outer component formed in the tub opening; and
            a cup-shaped bottom electrode inner component formed on the cup-shaped bottom electrode outer component;
        a cup-shaped insulator; and
        a top electrode; and
    a via formed in a via opening in the dielectric region;
    wherein the cup-shaped bottom electrode outer component comprises a first portion of a conformal metal layer, and the via comprises a second portion of the conformal metal layer; and
    wherein the cup-shaped bottom electrode inner component is formed from a different material than the cup-shaped bottom electrode outer component.

13. The integrated circuit structure of claim 10, wherein the cup-shaped insulator cap comprises $Al_2O_3$, $Ta_2O_5$, $ZrO_2$, $HfO_2$, Ti, or TiN.

* * * * *

UNITED STATES PATENT AND TRADEMARK OFFICE
CERTIFICATE OF CORRECTION

| | |
|---|---|
| PATENT NO. | : 12,010,932 B2 |
| APPLICATION NO. | : 17/379181 |
| DATED | : June 11, 2024 |
| INVENTOR(S) | : Yaojian Leng |

It is certified that error appears in the above-identified patent and that said Letters Patent is hereby corrected as shown below:

In the Claims

Column 18, Claim 11, Line 24:
"An integrated integrated circuit structure, comprising:'…"
Change to:
"An integrated circuit structure, comprising:…"

Column 18, Claim 12, Line 37:
"An integrated integrated circuit structure, comprising:'…"
Change to:
"An integrated circuit structure, comprising:…"

Signed and Sealed this
Twenty-sixth Day of November, 2024

Katherine Kelly Vidal
*Director of the United States Patent and Trademark Office*